United States Patent
Ahn et al.

(10) Patent No.: US 8,237,216 B2
(45) Date of Patent: Aug. 7, 2012

(54) APPARATUS HAVING A LANTHANUM-METAL OXIDE SEMICONDUCTOR DEVICE

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/915,578

(22) Filed: Oct. 29, 2010

(65) Prior Publication Data

US 2011/0037117 A1    Feb. 17, 2011

Related U.S. Application Data

(60) Continuation of application No. 11/608,286, filed on Dec. 8, 2006, now Pat. No. 7,867,919, which is a division of application No. 10/930,167, filed on Aug. 31, 2004, now Pat. No. 7,494,939.

(51) Int. Cl.
*H01L 29/792* (2006.01)

(52) U.S. Cl. ........ 257/324; 257/369; 257/411; 257/532; 257/E27.062; 257/E29.343; 438/778; 438/783; 438/785

(58) Field of Classification Search .................. None
See application file for complete search history.

(56) References Cited

U.S. PATENT DOCUMENTS

| | | |
|---|---|---|
| 3,488,633 A | 1/1970 | King et al. |
| 4,058,430 A | 11/1977 | Suntola et al. |
| 4,413,022 A | 11/1983 | Suntola et al. |
| 4,641,313 A | 2/1987 | Tobin et al. |
| 4,693,211 A | 9/1987 | Ogami et al. |
| 4,870,923 A | 10/1989 | Sugimoto |
| 5,049,516 A | 9/1991 | Arima |
| 5,055,319 A | 10/1991 | Bunshah et al. |
| 5,119,329 A | 6/1992 | Evans et al. |
| 5,192,871 A | 3/1993 | Ramakrishnan et al. |
| 5,223,001 A | 6/1993 | Saeki |
| 5,426,603 A | 6/1995 | Nakamura et al. |
| 5,439,524 A | 8/1995 | Cain et al. |
| 5,445,699 A | 8/1995 | Kamikawa et al. |
| 5,478,653 A | 12/1995 | Guenzer |
| 5,496,597 A | 3/1996 | Soininen et al. |
| 5,562,952 A | 10/1996 | Nakahigashi et al. |
| 5,572,052 A | 11/1996 | Kashihara et al. |

(Continued)

FOREIGN PATENT DOCUMENTS

EP     1096042 A1     5/2001

(Continued)

OTHER PUBLICATIONS

Booyong, S. L., et al., "Atomic Later deposition of lanthanum aluminum oxide nano-laminates for electrical applications", Journal of Applied Physics, vol. 84(20), (2004), 3957-3959.

(Continued)

*Primary Examiner* — Zandra Smith
*Assistant Examiner* — Khanh Duong
(74) *Attorney, Agent, or Firm* — Schwegman, Lundberg & Woessner, P.A.

(57) ABSTRACT

Lanthanum-metal oxide dielectrics and methods of fabricating such dielectrics provide an insulating layer in a variety of structures for use in a wide range of electronic devices and systems. In an embodiment, a lanthanum-metal oxide dielectric is formed using a trisethylcyclopentadionatolanthanum precursor and/or a trisdipyvaloylmethanatolanthanum precursor. Additional apparatus, systems, and methods are disclosed.

20 Claims, 5 Drawing Sheets

U.S. PATENT DOCUMENTS

| | | | |
|---|---|---|---|
| 5,674,563 A | 10/1997 | Tarui et al. | |
| 5,698,022 A | 12/1997 | Glassman et al. | |
| 5,739,524 A | 4/1998 | Fally | |
| 5,749,937 A | 5/1998 | Detering et al. | |
| 5,751,021 A | 5/1998 | Teraguchi | |
| 5,777,923 A | 7/1998 | Lee et al. | |
| 5,792,269 A | 8/1998 | Deacon et al. | |
| 5,801,105 A | 9/1998 | Yano et al. | |
| 5,810,923 A | 9/1998 | Yano et al. | |
| 5,814,584 A | 9/1998 | Tauber et al. | |
| 5,827,571 A | 10/1998 | Lee et al. | |
| 5,828,080 A | 10/1998 | Yano et al. | |
| 5,840,897 A | 11/1998 | Kirlin et al. | |
| 5,916,365 A | 6/1999 | Sherman | |
| 5,923,056 A | 7/1999 | Lee et al. | |
| 5,958,140 A | 9/1999 | Arami et al. | |
| 5,981,350 A | 11/1999 | Geusic et al. | |
| 5,998,264 A | 12/1999 | Wu | |
| 5,999,454 A | 12/1999 | Smith | |
| 6,010,969 A | 1/2000 | Vaartstra | |
| 6,019,848 A | 2/2000 | Frankel et al. | |
| 6,020,024 A | 2/2000 | Maiti et al. | |
| 6,020,243 A | 2/2000 | Wallace et al. | |
| 6,025,225 A | 2/2000 | Forbes et al. | |
| 6,025,627 A | 2/2000 | Forbes et al. | |
| 6,027,961 A | 2/2000 | Maiti et al. | |
| 6,034,015 A | 3/2000 | Lin et al. | |
| 6,059,885 A | 5/2000 | Ohashi et al. | |
| 6,060,755 A | 5/2000 | Ma et al. | |
| 6,075,691 A | 6/2000 | Duenas et al. | |
| 6,090,636 A | 7/2000 | Geusic et al. | |
| 6,110,529 A | 8/2000 | Gardiner et al. | |
| 6,110,544 A | 8/2000 | Yang et al. | |
| 6,134,175 A | 10/2000 | Forbes et al. | |
| 6,146,976 A | 11/2000 | Stecher et al. | |
| 6,150,188 A | 11/2000 | Geusic et al. | |
| 6,150,724 A | 11/2000 | Wenzel et al. | |
| 6,173,379 B1 | 1/2001 | Poplingher et al. | |
| 6,174,809 B1 | 1/2001 | Kang et al. | |
| 6,191,448 B1 | 2/2001 | Forbes et al. | |
| 6,198,168 B1 | 3/2001 | Geusic et al. | |
| 6,200,893 B1 | 3/2001 | Sneh | |
| 6,203,613 B1 | 3/2001 | Gates et al. | |
| 6,207,522 B1 | 3/2001 | Hunt et al. | |
| 6,207,589 B1 | 3/2001 | Ma et al. | |
| 6,210,999 B1 | 4/2001 | Gardner et al. | |
| 6,211,035 B1 | 4/2001 | Moise et al. | |
| 6,217,645 B1 | 4/2001 | Vaartstra | |
| 6,225,237 B1 | 5/2001 | Vaartstra | |
| 6,230,651 B1 | 5/2001 | Ni et al. | |
| 6,270,835 B1 | 8/2001 | Hunt et al. | |
| 6,273,951 B1 | 8/2001 | Vaartstra | |
| 6,274,937 B1 | 8/2001 | Ahn et al. | |
| 6,281,042 B1 | 8/2001 | Ahn et al. | |
| 6,289,842 B1 | 9/2001 | Tompa | |
| 6,294,420 B1 | 9/2001 | Tsu et al. | |
| 6,294,813 B1 | 9/2001 | Forbes et al. | |
| 6,297,103 B1 | 10/2001 | Ahn et al. | |
| 6,297,539 B1 | 10/2001 | Ma et al. | |
| 6,313,035 B1 | 11/2001 | Sandhu et al. | |
| 6,317,357 B1 | 11/2001 | Forbes | |
| 6,323,081 B1 | 11/2001 | Marsh | |
| 6,323,511 B1 | 11/2001 | Marsh | |
| 6,329,286 B1 | 12/2001 | Vaartstra | |
| 6,331,465 B1 | 12/2001 | Forbes et al. | |
| 6,342,445 B1 | 1/2002 | Marsh | |
| 6,350,704 B1 | 2/2002 | Ahn et al. | |
| 6,352,591 B1 | 3/2002 | Yieh et al. | |
| 6,365,470 B1 | 4/2002 | Maeda | |
| 6,368,398 B2 | 4/2002 | Vaartstra | |
| 6,380,579 B1 | 4/2002 | Nam et al. | |
| 6,381,124 B1 | 4/2002 | Whitcher et al. | |
| 6,381,168 B2 | 4/2002 | Forbes | |
| 6,383,861 B1 | 5/2002 | Gonzalez et al. | |
| 6,387,712 B1 | 5/2002 | Yano et al. | |
| 6,392,257 B1 | 5/2002 | Ramdani et al. | |
| 6,395,650 B1 | 5/2002 | Callegari et al. | |
| 6,399,979 B1 | 6/2002 | Noble et al. | |
| 6,403,414 B2 | 6/2002 | Marsh | |
| 6,404,027 B1 | 6/2002 | Hong et al. | |
| 6,407,427 B1 | 6/2002 | Oh | |
| 6,417,537 B1 | 7/2002 | Yang et al. | |
| 6,418,050 B2 | 7/2002 | Forbes | |
| 6,420,279 B1 | 7/2002 | Ono et al. | |
| 6,423,613 B1 | 7/2002 | Geusic | |
| 6,426,292 B2 | 7/2002 | Vaartstra | |
| 6,429,065 B2 | 8/2002 | Forbes | |
| 6,433,993 B1 | 8/2002 | Hunt et al. | |
| 6,434,041 B2 | 8/2002 | Forbes et al. | |
| 6,441,417 B1 * | 8/2002 | Zhang et al. | 257/295 |
| 6,444,592 B1 | 9/2002 | Ballantine et al. | |
| 6,451,641 B1 | 9/2002 | Halliyal et al. | |
| 6,451,695 B2 | 9/2002 | Sneh | |
| 6,452,119 B1 | 9/2002 | Gessner | |
| 6,452,229 B1 | 9/2002 | Krivokapic | |
| 6,454,912 B1 | 9/2002 | Ahn et al. | |
| 6,455,330 B1 | 9/2002 | Yao et al. | |
| 6,455,717 B1 | 9/2002 | Vaartstra | |
| 6,458,701 B1 | 10/2002 | Chae et al. | |
| 6,465,298 B2 | 10/2002 | Forbes et al. | |
| 6,465,334 B1 | 10/2002 | Buynoski et al. | |
| 6,465,853 B1 | 10/2002 | Hobbs et al. | |
| 6,476,434 B1 | 11/2002 | Noble et al. | |
| 6,482,740 B2 | 11/2002 | Soininen et al. | |
| 6,486,027 B1 | 11/2002 | Noble et al. | |
| 6,486,703 B2 | 11/2002 | Noble et al. | |
| 6,492,233 B2 | 12/2002 | Forbes et al. | |
| 6,495,436 B2 | 12/2002 | Ahn et al. | |
| 6,495,437 B1 | 12/2002 | Yu | |
| 6,495,458 B2 | 12/2002 | Marsh | |
| 6,498,065 B1 | 12/2002 | Forbes et al. | |
| 6,500,499 B1 | 12/2002 | Senzaki et al. | |
| 6,504,214 B1 | 1/2003 | Yu et al. | |
| 6,506,666 B2 | 1/2003 | Marsh | |
| 6,509,234 B1 | 1/2003 | Krivokapic | |
| 6,509,280 B2 | 1/2003 | Choi | |
| 6,514,808 B1 | 2/2003 | Samavedam | |
| 6,514,820 B2 | 2/2003 | Ahn et al. | |
| 6,514,828 B2 | 2/2003 | Ahn et al. | |
| 6,515,510 B2 | 2/2003 | Noble et al. | |
| 6,518,615 B1 | 2/2003 | Geusic et al. | |
| 6,518,634 B1 | 2/2003 | Nguyen | |
| 6,526,191 B1 | 2/2003 | Geusic et al. | |
| 6,527,866 B1 | 3/2003 | Matijasevic et al. | |
| 6,528,858 B1 | 3/2003 | Yu et al. | |
| 6,531,324 B2 | 3/2003 | Hsu et al. | |
| 6,531,354 B2 | 3/2003 | Maria et al. | |
| 6,534,357 B1 | 3/2003 | Basceri | |
| 6,534,420 B2 | 3/2003 | Ahn et al. | |
| 6,537,613 B1 | 3/2003 | Senzaki et al. | |
| 6,538,330 B1 | 3/2003 | Forbes | |
| 6,540,214 B2 | 4/2003 | Barber | |
| 6,541,079 B1 | 4/2003 | Bojarczuk, Jr. et al. | |
| 6,541,280 B2 | 4/2003 | Kaushik et al. | |
| 6,542,229 B1 | 4/2003 | Kalal et al. | |
| 6,544,846 B2 | 4/2003 | Ahn et al. | |
| 6,551,929 B1 | 4/2003 | Kori et al. | |
| 6,552,383 B2 | 4/2003 | Ahn et al. | |
| 6,552,388 B2 | 4/2003 | Wilk et al. | |
| 6,555,879 B1 | 4/2003 | Krivokapic et al. | |
| 6,559,014 B1 | 5/2003 | Jeon | |
| 6,562,491 B1 | 5/2003 | Jeon | |
| 6,570,248 B1 | 5/2003 | Ahn et al. | |
| 6,586,792 B2 | 7/2003 | Ahn et al. | |
| 6,590,252 B2 | 7/2003 | Kutsunai et al. | |
| 6,596,583 B2 | 7/2003 | Agarwal et al. | |
| 6,597,037 B1 | 7/2003 | Forbes et al. | |
| 6,602,720 B2 * | 8/2003 | Hsu et al. | 438/3 |
| 6,608,378 B2 | 8/2003 | Ahn et al. | |
| 6,613,656 B2 | 9/2003 | Li | |
| 6,617,634 B2 | 9/2003 | Marsh et al. | |
| 6,617,639 B1 | 9/2003 | Wang et al. | |
| 6,632,279 B1 | 10/2003 | Ritala et al. | |
| 6,638,810 B2 | 10/2003 | Bakli et al. | |
| 6,638,859 B2 | 10/2003 | Sneh et al. | |
| 6,642,573 B1 | 11/2003 | Halliyal et al. | |
| 6,645,882 B1 | 11/2003 | Halliyal et al. | |

| Patent No. | Date | Inventor(s) | |
|---|---|---|---|
| 6,646,307 B1 | 11/2003 | Yu et al. | |
| 6,652,924 B2 | 11/2003 | Sherman | |
| 6,653,209 B1 | 11/2003 | Yamagata | |
| 6,656,764 B1 | 12/2003 | Wang et al. | |
| 6,660,660 B2 | 12/2003 | Haukka et al. | |
| 6,661,058 B2 | 12/2003 | Ahn et al. | |
| 6,673,701 B1 | 1/2004 | Marsh et al. | |
| 6,686,212 B1 | 2/2004 | Conley, Jr. et al. | |
| 6,689,660 B1 | 2/2004 | Noble et al. | |
| 6,690,055 B1 | 2/2004 | Uhlenbrock et al. | |
| 6,699,747 B2 | 3/2004 | Ruff et al. | |
| 6,709,978 B2 | 3/2004 | Geusic et al. | |
| 6,709,989 B2 | 3/2004 | Ramdani et al. | |
| 6,710,538 B1 | 3/2004 | Ahn et al. | |
| 6,713,846 B1 | 3/2004 | Senzaki | |
| 6,723,577 B1 | 4/2004 | Geusic et al. | |
| 6,728,092 B2 | 4/2004 | Hunt et al. | |
| 6,730,163 B2 | 5/2004 | Vaartstra | |
| 6,730,164 B2 | 5/2004 | Vaartstra et al. | |
| 6,730,575 B2 | 5/2004 | Eldridge | |
| 6,754,108 B2 | 6/2004 | Forbes | |
| 6,756,298 B2 | 6/2004 | Ahn et al. | |
| 6,764,901 B2 | 7/2004 | Noble | |
| 6,767,582 B1 | 7/2004 | Elers | |
| 6,767,795 B2 | 7/2004 | Ahn et al. | |
| 6,768,175 B1 | 7/2004 | Morishita et al. | |
| 6,770,536 B2 | 8/2004 | Wilk et al. | |
| 6,774,050 B2 | 8/2004 | Ahn et al. | |
| 6,777,353 B2 | 8/2004 | Putkonen | |
| 6,777,715 B1 | 8/2004 | Geusic et al. | |
| 6,778,441 B2 | 8/2004 | Forbes et al. | |
| 6,780,704 B1 | 8/2004 | Raaijmakers et al. | |
| 6,784,049 B2 | 8/2004 | Vaartstra | |
| 6,787,370 B2 | 9/2004 | Forbes | |
| 6,787,413 B2 | 9/2004 | Ahn | |
| 6,787,421 B2 | 9/2004 | Gilmer et al. | |
| 6,790,791 B2 | 9/2004 | Ahn et al. | |
| 6,794,284 B2 | 9/2004 | Vaartstra | |
| 6,794,315 B1 | 9/2004 | Klemperer et al. | |
| 6,794,709 B2 | 9/2004 | Ahn et al. | |
| 6,800,567 B2 | 10/2004 | Cho | |
| 6,803,311 B2 | 10/2004 | Choi | |
| 6,803,326 B2 | 10/2004 | Ahn et al. | |
| 6,804,136 B2 | 10/2004 | Forbes | |
| 6,806,211 B2 | 10/2004 | Shinriki et al. | |
| 6,808,978 B2 | 10/2004 | Kim | |
| 6,812,100 B2 | 11/2004 | Ahn et al. | |
| 6,812,513 B2 | 11/2004 | Geusic et al. | |
| 6,812,516 B2 | 11/2004 | Noble, Jr. et al. | |
| 6,818,937 B2 | 11/2004 | Noble et al. | |
| 6,831,315 B2 | 12/2004 | Raaijmakers et al. | |
| 6,833,285 B1 | 12/2004 | Ahn et al. | |
| 6,833,308 B2 | 12/2004 | Ahn et al. | |
| 6,835,111 B2 | 12/2004 | Ahn et al. | |
| 6,844,203 B2 | 1/2005 | Ahn et al. | |
| 6,844,260 B2 | 1/2005 | Sarigiannis et al. | |
| 6,844,604 B2 | 1/2005 | Lee et al. | |
| 6,852,167 B2 | 2/2005 | Ahn | |
| 6,858,120 B2 | 2/2005 | Ahn et al. | |
| 6,858,444 B2 | 2/2005 | Ahn et al. | |
| 6,863,725 B2 | 3/2005 | Vaartstra et al. | |
| 6,864,191 B2 | 3/2005 | Yoon | |
| 6,878,624 B1 | 4/2005 | Bruley et al. | |
| 6,884,739 B2 | 4/2005 | Ahn et al. | |
| 6,888,739 B2 | 5/2005 | Forbes | |
| 6,893,984 B2 | 5/2005 | Ahn et al. | |
| 6,900,122 B2 | 5/2005 | Ahn et al. | |
| 6,914,800 B2 | 7/2005 | Ahn et al. | |
| 6,919,266 B2 | 7/2005 | Ahn et al. | |
| 6,921,702 B2 | 7/2005 | Ahn et al. | |
| 6,930,059 B2 | 8/2005 | Conley, Jr. et al. | |
| 6,930,346 B2 | 8/2005 | Ahn et al. | |
| 6,950,340 B2 | 9/2005 | Bhattacharyya | |
| 6,952,032 B2 | 10/2005 | Forbes et al. | |
| 6,953,730 B2 | 10/2005 | Ahn et al. | |
| 6,958,300 B2 | 10/2005 | Vaartstra et al. | |
| 6,958,302 B2 | 10/2005 | Ahn et al. | |
| 6,960,538 B2 | 11/2005 | Ahn et al. | |
| 6,967,159 B2 | 11/2005 | Vaartstra | |
| 6,979,855 B2 | 12/2005 | Ahn et al. | |
| 6,982,230 B2 * | 1/2006 | Cabral et al. | 438/778 |
| 6,984,592 B2 | 1/2006 | Vaartstra | |
| 6,989,565 B1 | 1/2006 | Aronowitz et al. | |
| 6,989,573 B2 | 1/2006 | Ahn et al. | |
| 6,995,081 B2 | 2/2006 | Vaartstra | |
| 7,026,694 B2 | 4/2006 | Ahn et al. | |
| 7,030,042 B2 | 4/2006 | Vaartstra et al. | |
| 7,041,609 B2 | 5/2006 | Vaartstra | |
| 7,045,430 B2 | 5/2006 | Ahn et al. | |
| 7,049,192 B2 | 5/2006 | Ahn et al. | |
| 7,064,058 B2 | 6/2006 | Ahn et al. | |
| 7,068,544 B2 | 6/2006 | Forbes et al. | |
| 7,077,902 B2 | 7/2006 | Vaartstra | |
| 7,081,421 B2 | 7/2006 | Ahn et al. | |
| 7,084,078 B2 | 8/2006 | Ahn et al. | |
| 7,087,481 B2 | 8/2006 | Vaartstra et al. | |
| 7,101,813 B2 | 9/2006 | Ahn et al. | |
| 7,102,875 B2 * | 9/2006 | Lee et al. | 361/312 |
| 7,112,485 B2 | 9/2006 | Vaartstra | |
| 7,112,841 B2 | 9/2006 | Eldridge et al. | |
| 7,115,166 B2 | 10/2006 | Vaartstra et al. | |
| 7,115,528 B2 | 10/2006 | Vaartstra et al. | |
| 7,122,464 B2 | 10/2006 | Vaartstra | |
| 7,125,815 B2 | 10/2006 | Vaartstra | |
| 7,129,553 B2 | 10/2006 | Ahn et al. | |
| 7,135,369 B2 | 11/2006 | Ahn et al. | |
| 7,135,421 B2 | 11/2006 | Ahn et al. | |
| 7,135,734 B2 | 11/2006 | Eldridge et al. | |
| 7,148,546 B2 | 12/2006 | Visokay et al. | |
| 7,148,548 B2 * | 12/2006 | Doczy et al. | 257/407 |
| 7,160,577 B2 | 1/2007 | Ahn et al. | |
| 7,169,673 B2 | 1/2007 | Ahn et al. | |
| 7,183,186 B2 | 2/2007 | Ahn et al. | |
| 7,192,824 B2 | 3/2007 | Ahn et al. | |
| 7,192,892 B2 | 3/2007 | Ahn et al. | |
| 7,195,999 B2 | 3/2007 | Forbes et al. | |
| 7,196,007 B2 | 3/2007 | Vaartstra | |
| 7,199,023 B2 | 4/2007 | Ahn et al. | |
| 7,205,218 B2 | 4/2007 | Ahn et al. | |
| 7,205,620 B2 | 4/2007 | Ahn et al. | |
| 7,208,804 B2 | 4/2007 | Ahn et al. | |
| 7,211,492 B2 | 5/2007 | Forbes et al. | |
| 7,214,994 B2 | 5/2007 | Forbes et al. | |
| 7,217,643 B2 | 5/2007 | Liang | |
| 7,221,017 B2 | 5/2007 | Forbes et al. | |
| 7,221,586 B2 | 5/2007 | Forbes et al. | |
| 7,235,501 B2 | 6/2007 | Ahn et al. | |
| 7,235,854 B2 | 6/2007 | Ahn et al. | |
| 7,250,367 B2 | 7/2007 | Vaartstra et al. | |
| 7,253,122 B2 | 8/2007 | Vaartstra | |
| 7,259,434 B2 | 8/2007 | Ahn et al. | |
| 7,271,077 B2 | 9/2007 | Vaartstra et al. | |
| 7,294,556 B2 | 11/2007 | Vaartstra | |
| 7,300,870 B2 | 11/2007 | Vaartstra | |
| 7,312,494 B2 | 12/2007 | Ahn et al. | |
| 7,323,424 B2 | 1/2008 | Ahn et al. | |
| 7,326,980 B2 | 2/2008 | Ahn et al. | |
| 7,332,442 B2 | 2/2008 | Vaartstra et al. | |
| 7,365,027 B2 | 4/2008 | Ahn et al. | |
| 7,368,402 B2 | 5/2008 | Vaartstra | |
| 7,374,617 B2 | 5/2008 | Vaartstra | |
| 7,374,964 B2 | 5/2008 | Ahn et al. | |
| 7,388,246 B2 | 6/2008 | Ahn et al. | |
| 7,390,756 B2 | 6/2008 | Ahn et al. | |
| 7,399,666 B2 | 7/2008 | Ahn et al. | |
| 7,402,876 B2 | 7/2008 | Ahn et al. | |
| 7,405,454 B2 | 7/2008 | Ahn et al. | |
| 7,410,668 B2 | 8/2008 | Ahn | |
| 7,410,910 B2 | 8/2008 | Ahn et al. | |
| 7,410,917 B2 | 8/2008 | Ahn et al. | |
| 7,410,918 B2 | 8/2008 | Vaartstra | |
| 7,411,237 B2 | 8/2008 | Ahn et al. | |
| 7,420,256 B2 * | 9/2008 | Chae et al. | 257/411 |
| 7,432,548 B2 | 10/2008 | Forbes et al. | |
| 7,433,237 B2 | 10/2008 | Forbes et al. | |
| 7,439,194 B2 | 10/2008 | Ahn et al. | |
| 7,473,956 B2 | 1/2009 | Eldridge et al. | |
| 7,485,544 B2 | 2/2009 | Forbes et al. | |

| | | | | | | |
|---|---|---|---|---|---|---|
| 7,489,545 | B2 | 2/2009 | Forbes et al. | 2003/0032238 A1 | 2/2003 | Kim et al. |
| 7,494,873 | B2 | 2/2009 | Forbes et al. | 2003/0032270 A1 | 2/2003 | Snyder et al. |
| 7,494,939 | B2 | 2/2009 | Ahn et al. | 2003/0042527 A1 | 3/2003 | Forbes et al. |
| 7,498,230 | B2 | 3/2009 | Ahn et al. | 2003/0043633 A1 | 3/2003 | Forbes et al. |
| 7,508,025 | B2 | 3/2009 | Eldridge et al. | 2003/0043637 A1 | 3/2003 | Forbes et al. |
| 7,508,648 | B2 | 3/2009 | Ahn et al. | 2003/0045060 A1 | 3/2003 | Ahn et al. |
| 7,511,326 | B2 | 3/2009 | Ahn et al. | 2003/0045078 A1 | 3/2003 | Ahn et al. |
| 7,517,783 | B2 | 4/2009 | Ahn et al. | 2003/0045082 A1 | 3/2003 | Eldridge et al. |
| 7,518,246 | B2 | 4/2009 | Ahn et al. | 2003/0048666 A1 | 3/2003 | Eldridge et al. |
| 7,531,869 | B2 | 5/2009 | Ahn et al. | 2003/0049942 A1 | 3/2003 | Haukka et al. |
| 7,544,604 | B2 | 6/2009 | Forbes et al. | 2003/0059535 A1 | 3/2003 | Luo et al. |
| 7,554,161 | B2 | 6/2009 | Ahn et al. | 2003/0068848 A1 | 4/2003 | Hsu et al. |
| 7,560,395 | B2 | 7/2009 | Ahn | 2003/0072882 A1 | 4/2003 | Ninisto et al. |
| 7,560,793 | B2 | 7/2009 | Derderian et al. | 2003/0104666 A1 | 6/2003 | Bojarczuk, Jr. et al. |
| 7,563,730 | B2 | 7/2009 | Forbes et al. | 2003/0119246 A1 | 6/2003 | Ahn |
| 7,572,695 | B2 | 8/2009 | Ahn et al. | 2003/0119291 A1 | 6/2003 | Ahn et al. |
| 7,582,549 | B2 | 9/2009 | Ahn et al. | 2003/0119313 A1 | 6/2003 | Yang et al. |
| 7,583,534 | B2 | 9/2009 | Forbes et al. | 2003/0124748 A1 | 7/2003 | Summerfelt et al. |
| 7,588,988 | B2 | 9/2009 | Ahn et al. | 2003/0124791 A1 | 7/2003 | Summerfelt et al. |
| 7,589,029 | B2 | 9/2009 | Derderian et al. | 2003/0132491 A1 | 7/2003 | Ahn |
| 7,601,649 | B2 | 10/2009 | Ahn et al. | 2003/0136995 A1 | 7/2003 | Geusic et al. |
| 7,602,030 | B2 | 10/2009 | Ahn et al. | 2003/0137019 A1 | 7/2003 | Maria et al. |
| 7,605,030 | B2 | 10/2009 | Forbes et al. | 2003/0139039 A1 | 7/2003 | Ahn et al. |
| 7,611,959 | B2 | 11/2009 | Ahn et al. | 2003/0157764 A1 | 8/2003 | Ahn et al. |
| 7,615,438 | B2 | 11/2009 | Ahn et al. | 2003/0161081 A1 | 8/2003 | Girardie |
| 7,625,794 | B2 | 12/2009 | Ahn et al. | 2003/0170389 A1 | 9/2003 | Sandhu |
| 7,662,729 | B2 | 2/2010 | Ahn et al. | 2003/0170450 A1 | 9/2003 | Stewart et al. |
| 7,670,646 | B2 | 3/2010 | Ahn et al. | 2003/0175411 A1 | 9/2003 | Kodas et al. |
| 7,687,409 | B2 | 3/2010 | Ahn et al. | 2003/0176065 A1 | 9/2003 | Vaartstra |
| 7,719,065 | B2 | 5/2010 | Ahn et al. | 2003/0179521 A1 | 9/2003 | Girardie |
| 7,727,905 | B2 | 6/2010 | Ahn et al. | 2003/0181039 A1 | 9/2003 | Sandhu et al. |
| 7,915,174 | B2 | 3/2011 | Ahn et al. | 2003/0181060 A1 | 9/2003 | Asai et al. |
| 2001/0002280 | A1 | 5/2001 | Sneh | 2003/0183156 A1 | 10/2003 | Dando et al. |
| 2001/0009695 | A1 | 7/2001 | Saanila et al. | 2003/0185980 A1 | 10/2003 | Endo |
| 2001/0030352 | A1 | 10/2001 | Ruf et al. | 2003/0200917 A1 | 10/2003 | Vaartstra |
| 2002/0001971 | A1 | 1/2002 | Cho | 2003/0205742 A1 | 11/2003 | Hsu et al. |
| 2002/0004276 | A1 | 1/2002 | Ahn et al. | 2003/0207032 A1 | 11/2003 | Ahn et al. |
| 2002/0004277 | A1 | 1/2002 | Ahn et al. | 2003/0207540 A1 | 11/2003 | Ahn et al. |
| 2002/0024080 | A1 | 2/2002 | Derderian et al. | 2003/0222300 A1 | 12/2003 | Basceri et al. |
| 2002/0025628 | A1 | 2/2002 | Derderian et al. | 2003/0227033 A1 | 12/2003 | Ahn et al. |
| 2002/0046705 | A1 | 4/2002 | Sandhu et al. | 2003/0228747 A1 | 12/2003 | Ahn et al. |
| 2002/0053869 | A1 | 5/2002 | Ahn et al. | 2004/0004244 A1 | 1/2004 | Ahn et al. |
| 2002/0068466 | A1 | 6/2002 | Lee et al. | 2004/0004245 A1 | 1/2004 | Forbes et al. |
| 2002/0086507 | A1 | 7/2002 | Park et al. | 2004/0004247 A1 | 1/2004 | Forbes et al. |
| 2002/0086521 | A1 | 7/2002 | Ahn et al. | 2004/0004859 A1 | 1/2004 | Forbes et al. |
| 2002/0086555 | A1 | 7/2002 | Ahn et al. | 2004/0007171 A1 | 1/2004 | Ritala et al. |
| 2002/0089023 | A1 | 7/2002 | Yu et al. | 2004/0009679 A1 | 1/2004 | Yeo et al. |
| 2002/0089063 | A1 | 7/2002 | Ahn et al. | 2004/0013009 A1 | 1/2004 | Tsunoda et al. |
| 2002/0094632 | A1 | 7/2002 | Agarwal et al. | 2004/0016944 A1 | 1/2004 | Ahn et al. |
| 2002/0100418 | A1 | 8/2002 | Sandhu et al. | 2004/0023461 A1 | 2/2004 | Ahn et al. |
| 2002/0102818 | A1 | 8/2002 | Sandhu et al. | 2004/0028811 A1 | 2/2004 | Cho et al. |
| 2002/0110991 | A1 | 8/2002 | Li | 2004/0033661 A1 | 2/2004 | Yeo et al. |
| 2002/0111001 | A1 | 8/2002 | Ahn | 2004/0033681 A1 | 2/2004 | Ahn et al. |
| 2002/0122885 | A1 | 9/2002 | Ahn | 2004/0033701 A1 | 2/2004 | Ahn et al. |
| 2002/0130338 | A1 | 9/2002 | Ahn et al. | 2004/0036129 A1 | 2/2004 | Forbes et al. |
| 2002/0135048 | A1 | 9/2002 | Ahn et al. | 2004/0038554 A1 | 2/2004 | Ahn |
| 2002/0142536 | A1 | 10/2002 | Zhang et al. | 2004/0040501 A1 | 3/2004 | Vaartstra |
| 2002/0146916 | A1 | 10/2002 | Irino et al. | 2004/0041591 A1 | 3/2004 | Forbes |
| 2002/0155688 | A1 | 10/2002 | Ahn | 2004/0043151 A1 | 3/2004 | Vaartstra |
| 2002/0155689 | A1 | 10/2002 | Ahn | 2004/0043541 A1 | 3/2004 | Ahn et al. |
| 2002/0164420 | A1 | 11/2002 | Derderian et al. | 2004/0043569 A1 | 3/2004 | Ahn et al. |
| 2002/0167057 | A1 | 11/2002 | Ahn et al. | 2004/0043578 A1 | 3/2004 | Marsh |
| 2002/0167089 | A1 | 11/2002 | Ahn et al. | 2004/0043600 A1 | 3/2004 | Vaartstra |
| 2002/0170671 | A1 | 11/2002 | Matsuhita et al. | 2004/0043604 A1 | 3/2004 | Vaartstra |
| 2002/0177244 | A1 | 11/2002 | Hsu et al. | 2004/0043625 A1 | 3/2004 | Vaartstra et al. |
| 2002/0177282 | A1 | 11/2002 | Song | 2004/0043630 A1 | 3/2004 | Vaartstra et al. |
| 2002/0192974 | A1 | 12/2002 | Ahn et al. | 2004/0043632 A1 | 3/2004 | Vaartstra |
| 2002/0192975 | A1 | 12/2002 | Ahn | 2004/0043633 A1 | 3/2004 | Vaartstra |
| 2002/0192979 | A1 | 12/2002 | Ahn | 2004/0043634 A1 | 3/2004 | Vaartstra |
| 2002/0195056 | A1 | 12/2002 | Sandhu et al. | 2004/0043635 A1 | 3/2004 | Vaartstra |
| 2003/0001241 | A1 | 1/2003 | Chakrabarti et al. | 2004/0043636 A1 | 3/2004 | Vaartstra et al. |
| 2003/0003635 | A1 | 1/2003 | Paranjpe et al. | 2004/0076035 A1 | 4/2004 | Saito et al. |
| 2003/0003702 | A1 | 1/2003 | Ahn | 2004/0094801 A1 | 5/2004 | Liang et al. |
| 2003/0003722 | A1 | 1/2003 | Vaartstra | 2004/0106249 A1 | 6/2004 | Huotari |
| 2003/0003730 | A1 | 1/2003 | Li | 2004/0110348 A1 | 6/2004 | Ahn et al. |
| 2003/0008243 | A1 | 1/2003 | Ahn | 2004/0110391 A1 | 6/2004 | Ahn et al. |
| 2003/0017717 | A1 | 1/2003 | Ahn et al. | 2004/0126954 A1 | 7/2004 | Vaartstra et al. |
| 2003/0020180 | A1 | 1/2003 | Ahn et al. | 2004/0135186 A1 | 7/2004 | Yamamoto |
| 2003/0027360 | A1 | 2/2003 | Hsu et al. | 2004/0140513 A1 | 7/2004 | Forbes et al. |

| | | | | | | |
|---|---|---|---|---|---|---|
| 2004/0144980 A1 | 7/2004 | Ahn et al. | | 2005/0287804 A1 | 12/2005 | Vaaartstra |
| 2004/0152254 A1 | 8/2004 | Vaartstra et al. | | 2005/0287819 A1 | 12/2005 | Vaartstra et al. |
| 2004/0156578 A1 | 8/2004 | Geusic et al. | | 2006/0000412 A1 | 1/2006 | Ahn et al. |
| 2004/0159863 A1 | 8/2004 | Eldridge et al. | | 2006/0001151 A1 | 1/2006 | Ahn et al. |
| 2004/0161899 A1 | 8/2004 | Luo et al. | | 2006/0003517 A1 | 1/2006 | Ahn et al. |
| 2004/0164357 A1 | 8/2004 | Ahn et al. | | 2006/0023513 A1 | 2/2006 | Forbes et al. |
| 2004/0164365 A1 | 8/2004 | Ahn et al. | | 2006/0024975 A1 | 2/2006 | Ahn et al. |
| 2004/0168627 A1 | 9/2004 | Conley, Jr. et al. | | 2006/0028867 A1 | 2/2006 | Forbes et al. |
| 2004/0169453 A1 | 9/2004 | Ahn et al. | | 2006/0028869 A1 | 2/2006 | Forbes et al. |
| 2004/0171280 A1 | 9/2004 | Conley, Jr. et al. | | 2006/0043492 A1 | 3/2006 | Ahn et al. |
| 2004/0175882 A1 | 9/2004 | Ahn et al. | | 2006/0043504 A1 | 3/2006 | Ahn et al. |
| 2004/0183108 A1 | 9/2004 | Ahn | | 2006/0046505 A1 | 3/2006 | Ahn et al. |
| 2004/0185654 A1 | 9/2004 | Ahn | | 2006/0046521 A1 | 3/2006 | Vaartstra et al. |
| 2004/0187968 A1 | 9/2004 | Vaartstra | | 2006/0046522 A1 | 3/2006 | Ahn et al. |
| 2004/0189175 A1 | 9/2004 | Ahn et al. | | 2006/0048711 A1 | 3/2006 | Vaartstra |
| 2004/0197946 A1 | 10/2004 | Vaartstra et al. | | 2006/0125030 A1 | 6/2006 | Ahn et al. |
| 2004/0203254 A1 | 10/2004 | Conley, Jr. et al. | | 2006/0128168 A1 | 6/2006 | Ahn et al. |
| 2004/0214399 A1 | 10/2004 | Ahn et al. | | 2006/0148180 A1 | 7/2006 | Ahn et al. |
| 2004/0219746 A1 | 11/2004 | Vaartstra et al. | | 2006/0172485 A1 | 8/2006 | Vaartstra |
| 2004/0219783 A1 | 11/2004 | Ahn et al. | | 2006/0176645 A1 | 8/2006 | Ahn et al. |
| 2004/0222476 A1 | 11/2004 | Ahn et al. | | 2006/0177975 A1 | 8/2006 | Ahn et al. |
| 2004/0233010 A1 | 11/2004 | Akram et al. | | 2006/0183272 A1 | 8/2006 | Ahn et al. |
| 2004/0235313 A1 | 11/2004 | Frank et al. | | 2006/0189154 A1 | 8/2006 | Ahn et al. |
| 2004/0248398 A1 | 12/2004 | Ahn et al. | | 2006/0223337 A1 | 10/2006 | Ahn et al. |
| 2004/0262700 A1 | 12/2004 | Ahn et al. | | 2006/0228868 A1 | 10/2006 | Ahn et al. |
| 2004/0264236 A1 | 12/2004 | Chae et al. | | 2006/0231017 A1 | 10/2006 | Vaartstra |
| 2004/0266217 A1 | 12/2004 | Kim et al. | | 2006/0237764 A1 | 10/2006 | Ahn et al. |
| 2005/0009266 A1 | 1/2005 | Vaartstra | | 2006/0244082 A1 | 11/2006 | Ahn et al. |
| 2005/0009368 A1 | 1/2005 | Vaartstra | | 2006/0244100 A1 | 11/2006 | Ahn et al. |
| 2005/0009370 A1 | 1/2005 | Ahn | | 2006/0246741 A1 | 11/2006 | Ahn et al. |
| 2005/0019978 A1 | 1/2005 | Vaartstra et al. | | 2006/0252211 A1 | 11/2006 | Ahn et al. |
| 2005/0023574 A1 | 2/2005 | Forbes et al. | | 2006/0252244 A1 | 11/2006 | Vaartstra et al. |
| 2005/0023594 A1 | 2/2005 | Ahn et al. | | 2006/0252279 A1 | 11/2006 | Vaartstra |
| 2005/0023595 A1 | 2/2005 | Forbes et al. | | 2006/0255470 A1 | 11/2006 | Ahn et al. |
| 2005/0023602 A1 | 2/2005 | Forbes et al. | | 2006/0258175 A1 | 11/2006 | Vaartstra et al. |
| 2005/0023603 A1 | 2/2005 | Eldridge et al. | | 2006/0261389 A1 | 11/2006 | Vaartstra |
| 2005/0023624 A1 | 2/2005 | Ahn et al. | | 2006/0261397 A1 | 11/2006 | Ahn et al. |
| 2005/0023625 A1 | 2/2005 | Ahn et al. | | 2006/0263972 A1 | 11/2006 | Ahn et al. |
| 2005/0023626 A1 | 2/2005 | Ahn et al. | | 2006/0264064 A1 | 11/2006 | Ahn et al. |
| 2005/0023627 A1 | 2/2005 | Ahn et al. | | 2006/0270147 A1 | 11/2006 | Ahn et al. |
| 2005/0024092 A1 | 2/2005 | Forbes | | 2006/0281330 A1 | 12/2006 | Ahn et al. |
| 2005/0026349 A1 | 2/2005 | Forbes et al. | | 2006/0284246 A1 | 12/2006 | Forbes et al. |
| 2005/0026360 A1 | 2/2005 | Geusic et al. | | 2006/0292788 A1 | 12/2006 | Vaartstra |
| 2005/0026458 A1 | 2/2005 | Basceri et al. | | 2007/0006798 A1 | 1/2007 | Vaartstra et al. |
| 2005/0028733 A1 | 2/2005 | Vaartstra | | 2007/0007560 A1 | 1/2007 | Forbes et al. |
| 2005/0029547 A1 | 2/2005 | Ahn et al. | | 2007/0007635 A1 | 1/2007 | Forbes et al. |
| 2005/0029604 A1 | 2/2005 | Ahn et al. | | 2007/0010060 A1 | 1/2007 | Forbes et al. |
| 2005/0029605 A1 | 2/2005 | Ahn et al. | | 2007/0010061 A1 | 1/2007 | Forbes et al. |
| 2005/0030825 A1 | 2/2005 | Ahn | | 2007/0018214 A1 | 1/2007 | Ahn |
| 2005/0032292 A1 | 2/2005 | Ahn et al. | | 2007/0020835 A1 | 1/2007 | Ahn et al. |
| 2005/0032342 A1 | 2/2005 | Forbes et al. | | 2007/0037415 A1 | 2/2007 | Ahn et al. |
| 2005/0032360 A1 | 2/2005 | Vaartstra | | 2007/0045676 A1 | 3/2007 | Forbes et al. |
| 2005/0034662 A1 | 2/2005 | Ahn | | 2007/0045752 A1 | 3/2007 | Forbes et al. |
| 2005/0037563 A1 | 2/2005 | Ahn | | 2007/0048926 A1 | 3/2007 | Ahn |
| 2005/0051828 A1 | 3/2005 | Park et al. | | 2007/0049023 A1 | 3/2007 | Ahn et al. |
| 2005/0054165 A1 | 3/2005 | Ahn et al. | | 2007/0049051 A1 | 3/2007 | Ahn et al. |
| 2005/0070098 A1 | 3/2005 | Bruley | | 2007/0049054 A1 | 3/2007 | Ahn et al. |
| 2005/0077519 A1 | 4/2005 | Ahn et al. | | 2007/0059881 A1 | 3/2007 | Ahn et al. |
| 2005/0087134 A1 | 4/2005 | Ahn | | 2007/0090440 A1 | 4/2007 | Ahn et al. |
| 2005/0124171 A1 | 6/2005 | Vaartstra | | 2007/0090441 A1 | 4/2007 | Ahn et al. |
| 2005/0124174 A1 | 6/2005 | Ahn et al. | | 2007/0099366 A1 | 5/2007 | Ahn et al. |
| 2005/0124175 A1 | 6/2005 | Ahn et al. | | 2007/0101929 A1 | 5/2007 | Ahn et al. |
| 2005/0136689 A9 | 6/2005 | Vaartstra | | 2007/0107661 A1 | 5/2007 | Ahn |
| 2005/0138262 A1 | 6/2005 | Forbes | | 2007/0111544 A1 | 5/2007 | Ahn |
| 2005/0140462 A1 | 6/2005 | Akram et al. | | 2007/0131169 A1 | 6/2007 | Ahn |
| 2005/0145957 A1 | 7/2005 | Ahn et al. | | 2007/0144438 A1 | 6/2007 | Vaartstra |
| 2005/0145959 A1 | 7/2005 | Forbes | | 2007/0155190 A1 | 7/2007 | Vaartstra et al. |
| 2005/0151184 A1 | 7/2005 | Lee et al. | | 2007/0158765 A1 | 7/2007 | Ahn et al. |
| 2005/0156256 A1 | 7/2005 | Kim et al. | | 2007/0161260 A1 | 7/2007 | Vaartstra |
| 2005/0158973 A1 | 7/2005 | Ahn et al. | | 2007/0166999 A1 | 7/2007 | Vaartstra |
| 2005/0160981 A9 | 7/2005 | Vaartstra et al. | | 2007/0178643 A1 | 8/2007 | Forbes et al. |
| 2005/0164521 A1 | 7/2005 | Ahn et al. | | 2007/0181931 A1 | 8/2007 | Ahn et al. |
| 2005/0215015 A1 | 9/2005 | Ahn et al. | | 2007/0187772 A1 | 8/2007 | Ahn et al. |
| 2005/0218462 A1 | 10/2005 | Ahn et al. | | 2007/0187831 A1 | 8/2007 | Ahn et al. |
| 2005/0221006 A1 | 10/2005 | Vaartstra et al. | | 2007/0234949 A1 | 10/2007 | Ahn et al. |
| 2005/0227442 A1 | 10/2005 | Ahn et al. | | 2007/0295273 A1 | 12/2007 | Vaartstra |
| 2005/0260357 A1 | 11/2005 | Olsen et al. | | 2008/0029790 A1 | 2/2008 | Ahn et al. |
| 2005/0277256 A1 | 12/2005 | Ahn et al. | | 2008/0032424 A1 | 2/2008 | Ahn et al. |
| 2005/0280067 A1 | 12/2005 | Ahn et al. | | 2008/0032465 A1 | 2/2008 | Ahn et al. |

| | | | |
|---|---|---|---|
| 2008/0048225 A1 | 2/2008 | Ahn et al. | |
| 2008/0057659 A1 | 3/2008 | Forbes | |
| 2008/0057690 A1 | 3/2008 | Forbes | |
| 2008/0064210 A1 | 3/2008 | Vaartstra | |
| 2008/0087890 A1 | 4/2008 | Ahn et al. | |
| 2008/0087945 A1 | 4/2008 | Forbes et al. | |
| 2008/0099829 A1 | 5/2008 | Forbes et al. | |
| 2008/0102629 A1 | 5/2008 | Vaartstra | |
| 2008/0121962 A1 | 5/2008 | Forbes et al. | |
| 2008/0124907 A1 | 5/2008 | Forbes et al. | |
| 2008/0124908 A1 | 5/2008 | Forbes et al. | |
| 2008/0191350 A1 | 8/2008 | Ahn et al. | |
| 2008/0191351 A1 | 8/2008 | Ahn et al. | |
| 2008/0193791 A1 | 8/2008 | Ahn et al. | |
| 2008/0194094 A1 | 8/2008 | Ahn et al. | |
| 2008/0217676 A1 | 9/2008 | Ahn et al. | |
| 2008/0220618 A1 | 9/2008 | Ahn et al. | |
| 2008/0248618 A1 | 10/2008 | Ahn et al. | |
| 2008/0274625 A1 | 11/2008 | Ahn et al. | |
| 2009/0002025 A1 | 1/2009 | Forbes et al. | |
| 2009/0004801 A1 | 1/2009 | Ahn et al. | |
| 2009/0032910 A1 | 2/2009 | Ahn et al. | |
| 2009/0108363 A1 | 4/2009 | Forbes et al. | |
| 2009/0155976 A1 | 6/2009 | Ahn et al. | |
| 2009/0173979 A1 | 7/2009 | Ahn et al. | |
| 2009/0218612 A1 | 9/2009 | Forbes et al. | |
| 2009/0236650 A1 | 9/2009 | Forbes et al. | |
| 2009/0294924 A1 | 12/2009 | Forbes et al. | |
| 2010/0029054 A1 | 2/2010 | Ahn et al. | |
| 2010/0044771 A1 | 2/2010 | Ahn et al. | |

FOREIGN PATENT DOCUMENTS

| | | |
|---|---|---|
| EP | 1124262 A2 | 8/2001 |
| WO | WO-0197257 A2 | 12/2001 |
| WO | WO-0231875 A2 | 4/2002 |
| WO | WO-0243115 A2 | 5/2002 |

OTHER PUBLICATIONS

Chin, A., et al., "High Quality $La_2O_3$ and $Al_2O_3$ Gate Dielectrics with Equivalent Oxide Thickness 5-10A", Digest of Technical Papers. 2000 Symposium on VLSI Technology, 2000, Honolulu, (Jun. 13-15, 2000), 16-17.

Copel, M., et al., "Formation of a stratified lanthanum silicate dielectric by reaction with Si(001)", Applied Physics Letters, 78(11), (Mar. 12, 2001), 1607-1609.

Copel, M., et al., "Structure and stability of ultrathin zirconium oxide layers on Si(001)", Applied Physics Letters, 76(4), (Jan. 2000), 436-438.

Dimoulas, A., et al., "Structural and electrical quality of the high-k dielectric $Y_2O_3$ on Si (001): Dependence on growth parameters", Journal of Applied Physics, 92(1), (Jul. 1, 2002), 426-431.

Geller, S., et al., "Crystallographic Studies of Perovskite-like Compounds. II. Rare Earth Aluminates", Acta Cryst., 9, (May 1956), 1019-1025.

Giess, E. A., et al., "Lanthanide gallate perovskite-type substrates for epitaxial, high-$T_c$ superconducting $Ba_2YC_3O_{7-\delta}$ films", IBM Journal of Research and Development, 34(6), (Nov. 1990), 916-926.

Guha, S, et al., "Atomic beam deposition of lanthanum-and yttrium-based oxide thin films for gate dielectrics", Applied Physics Letters, 77, (2000), 2710-2712.

Guha, S., et al., "High temperature stability of $Al_2O_3$ dielectrics on Si: Interfacial metal diffusion and mobility degradation", Applied Physics Letters, vol. 81, No. 16, (Oct. 14, 2002), 2956-2958.

Ho, M.-Y., et al., "Suppressed crystallization of Hf-based gate dielectrics by controlled addition of $Al_2O_3$ using atomic layer deposition", Applied Physics Letters, vol. 81, No. 22, (Nov. 2002), 4218-4220.

Huang, C. H., et al., "$La_2O_3Si_{0.3}Ge_{0.7}$ p-MOSFETs with high hole mobility and good device characteristics", IEEE Electron Device Letters, 23(12), (Dec. 2002), 710-712.

Hubbard, K. J., et al., "Thermodynamic stability of binary oxides in contact with silicon", Journal of Materials Research, 11(11), (Nov. 1996), 2757-2776.

Iwai, H., et al., "Advanced gate dielectric materials for sub-100 nm CMOS", International Electron Devices Meeting, 2002. IEDM '02. Digest., (Dec. 8-11, 2002), 625-628.

Iwamoto, K., "Advanced Layer-By-Layer Deposition and Annealing Process for High-Quality High-K Dielectrics Formation", Electrochemical Society Proceedings vol. 2003 (14), (2003), 265-272.

Jeon, Sanghun, et al., "Excellent electrical characteristics of lanthanide (Pr, Nd, Sm, Gd, and Dy) oxide and lanthanide-doped oxide for MOS gate dielectric applications", Electron Devices Meeting, 2001. IEDM Technical Digest. International, (2001), 471-474.

Jeong, Chang-Wook, "Plasma-Assisted Atomic Layer Growth of High-Quality Aluminum Oxide Thin Films", Japanese Journal of Applied Physics, Part 1: Regular Papers and Short Notes and Review Papers, 40(1), (Jan. 2001), 285-289.

Jun, Jin Hyung, et al., "Effect of Structural Properties on Electrical Properties of Lanthanum Oxide Thin Film as a Gate Dielectric", Japanese Journal of Applied Physics, 42, Part 1, No. 6A, (Jun. 15, 2003), 3519-3522.

Jun, Jin Hyung, et al., "Properties of Lanthanum Aluminate Thin Film Deposited by MOCVD", Electrochemical and Solid-State Letters, 6(11), (2003), F37-F39.

Jun, Jino, et al., "Study on the precursors for $La_2O_3$ thin films deposited on silicon substrate", Journal of Materials Science Letters 21, (2002), 1847-1849.

Kim, C. T., "Application of $Al_2O_3$ Grown by Atomic Layer Deposition to DRAM and FeRAM", 12th International Symposium in Integrated Ferroelectrics, (Mar. 2000), p. 316.

Kim, D., et al., "Atomic Control of Substrate Termination and Heteroepitaxial Growth of $SrTiO_3LaAIO_3$ Films", Journal of the Korean Physical Society, 36(6), (Jun. 2000), 444-448.

Kim, Y, et al., "Substrate dependence on the optical properties of $Al_2O_3$ films grown by atomic layer deposition", Applied Physics Letters, 71(25), (Dec. 22, 1997), 3604-3606.

Kingon, Angus I, et al., "review article Alternative dielectrics to silicon dioxide for memory and logic devices", Nature, 406, (Aug. 31, 2000), 1032-1038.

Kwo, J., et al., "High E gate dielectrics $Gd_2O_3$ and $Y_2O_3$ for silicon", Applied Physics Letters, 77(1), (Jul. 3, 2000), 130-132.

Kwo, J., "Properties of high k gate dielectrics $Gd_2O_3$ and $Y_2O_3$ for Si", Journal of Applied Physics, 89(7), (2001), 3920-3927.

Lee, A E, et al., "Epitaxially grown sputtered $LaAlO_3$ films", Applied Physics Letters, 57(19), (Nov. 1990), 2019-2021.

Lee, Byoung Hun, et al., "Thermal stability and electrical characteristics of ultrathin hafnium oxide gate dielectric reoxidized with rapid thermal annealing", Applied Physics Letters, 76(14), (Apr. 3, 2000), 1926-1928.

Leskela, M., "ALD precursor chemistry: Evolution and future challenges", J. Phys. IV France, 9, (1999), 837-852.

Li, Al-Dong, "Characteristics of LaAlO3 gate dielectrics on Si grown by metalorganic chemical vapor deposition", Applied Physics Letters, vol. 83, No. 17, (Oct. 27, 2003), 3540-3542.

Lu, X. B., et al., "Investigation of high-quality ultra-thin $LaAlO_3$ films as high-k gate dielectrics", Journal of Physics D: Applied Physics, 36, (Dec. 7, 2003), 3047-3050.

Lu, Xu-Bing, et al., "Structure and dielectric properties of amorphous $LaAlOsub_3$ and $LaAlO_x N_y$ films as alternative gate dielectric materials", Journal of Applied Physics, 94(2), (Jul. 15, 2003), 1229-1234.

Maria, J. P., et al., "High temperature stability in lanthanum and zirconia-based gate dielectrics", Journal of Applied Physics, 90(7), (Oct. 1, 2001), 3476-3482.

Michaelson, Herbert B., "The work function of the elements and its periodicity", Journal of Applied Physics, 48(11), (Nov. 1977), 4729-4733.

Molodyk, A A, et al., "Volatile Surfactant-Assisted MOCVD: Application to $LaAlO_3$ Thin Film Growth", Chemical Vapor Deposition, 6(3), (Jun. 2000), 133-138.

Nalwa, H. S, "Handbook of Thin Film Materials", Deposition and Processing of Thin Films, vol. 1, San Diego : Academic Press, (2002), 114-119.

Nieminen, Minna, et al., "Atomic layer epitaxy growth of $LaGaO_3$ thin films", J. Mater Chem., vol. 11, (Nov. 2001), 3148-3153.

Nieminen, Minna, et al., "Formation and stability of lanthanum oxide thin films deposited from B-diketonate precursor", Applied Surface Science, 174(2), (Apr. 16, 2001), 155-165.

Osten, H. J., et al., "High-k gate dielectrics with ultra-low leakage current based on praseodymium oxide", International Electron Devices Meeting 2000. Technical Digest. IEDM, (2000), 653-656.

Park, Byung-Eun, et al., "Electrical properties of LaAlO$_3$/Si and Sr0.8Bi2.2Ta2O9/LaAlO3/Si structures", Applied Physics Letters, 79(6), (Aug. 2001), 806-808.

Park, Dae-Gyu, et al., "Characteristics of Al2O3 Gate Dielectrics Prepared by Atomic Layer Deposition for Giga Scale CMOS DRAM Devices", 2000 Symposium on VLSI Technology Digest of Technical Papers, (2000), 46-47.

Ritala, M., "Atomic layer deposition of oxide thin films with metal alkoxides as oxygen sources", Science, 288(5464), (Apr. 14, 2000), 319-321.

Robertson, J., "Band offsets of wide-band-gap oxides and implications for future electronic devices", Journal of Vacuum Science & Technology B (Microelectronics and Nanometer Structures), 18(3), (May-Jun. 2000), 1785-1791.

Roy, P. K., et al., "Stacked high-E gate dielectric for gigascale integration of metal-oxide-semiconductor technologies", Applied Physics Letters, vol. 72, No. 22, (Jun. 1998), 2835-2837.

Shimizu, Takashi, et al., "Electrical Properties of Ruthenium/ Metalorganic Chemical Vapor Deposited La-Oxide/Si Field Effect Transistors", Jpn. J. Appl. Phys., vol. 42, Part 2, No. 11A, (2003), L1315-L1317.

Shin, Chang Ho, "Fabrication and Characterization of MFISFET Using Al$_2$O$_3$ Insulating Layer for Non-volatile Memory", 12th International Symposium in Integrated Ferroelectrics, (Mar. 2000), 9 pages.

Sneh, Ofer, "Thin film atomic layer deposition equipment for semiconductor processing", Thin Solid Films, 402(1-2), Preparation and Characterization,Elsevier Sequoia, NL, 402(1-2), (2002), 248-261.

Somorjai, "Introduction to surface chemistry and catalysis", (1994), 336-337.

Suntola, T., "Atomic Layer Epitaxy", Handbook of Crystal Growth, 3; Thin Films of Epitaxy, Part B: Growth Mechanics and Dynamics, Amsterdam, (1994), 601-663.

Suntola, Tuomo, "Atomic layer epitaxy", Thin Solid Films, 216(1), (Aug. 28, 1992), 84-89.

Van Dover, R B, "Amorphous lanthanide-doped TioO$_x$ dielectric films", Applied Physics Letters, 74(20), (May 1999), 3041-3043.

Wilk, G. D., "High-K gate dielectrics: Current status and materials properties considerations", Journal of Applied Physics, 89(10), (May 2001), 5243-5275.

Yamada, Hirotoshi, et al., "MOCVD of High-Dielectric-Constant Lanthanum Oxide Thin Films", Journal of the Electrochemical Society, 150(8), (Aug. 2003), G429-G435.

Zhang, H, et al., "High permitivity thin film nanolaminates", Journal of Applied Physics, 87(4), (Feb. 2000), 1921-1924.

Zhang, H., "Atomic Layer Deposition of High Dielectric Constant Nanolaminates", Journal of the Electrochemical Society, 148(4), (Apr. 2001), F63-F66.

Zhong, Huicai, et al., "Electrical Properties of Ru and RuO$_2$ Gate Electrodes for Si-PMOSFET with ZrO$_2$ and Zr-Silicate Dielectrics", Journal of Electronic Materials, 30(12), (Dec. 2001), 1493-1498.

* cited by examiner

APPARATUS HAVING A LANTHANUM-METAL OXIDE SEMICONDUCTOR DEVICE

This application is a continuation of U.S. application Ser. No. 11/608,286 filed Dec. 8, 2006 now U.S. Pat. No. 7,867,919, which is a divisional of U.S. application Ser. No. 10/930,167 filed Aug. 31, 2004, now issued as U.S. Pat. No. 7,494,939, which applications are incorporated herein by reference, each in its entirety.

TECHNICAL FIELD

This application relates generally to semiconductor devices and device fabrication and, more particularly, to dielectric layers and their method of fabrication.

BACKGROUND

The semiconductor device industry has a market driven need to reduce the size of devices such as transistors. To reduce transistor size, the thickness of the silicon dioxide, $SiO_2$, gate dielectric is reduced in proportion to the shrinkage of the gate length. For example, a metal-oxide-semiconductor field effect transistor (MOSFET) would use a 1.5 nm thick $SiO_2$ gate dielectric for a gate length of 70 nm. A goal is to fabricate increasingly smaller and more reliable integrated circuits (ICs) for use in products such as processor chips, mobile telephones, and memory devices such as dynamic random access memories (DRAMs).

Currently, the semiconductor industry relies on the ability to reduce or scale the dimensions of its basic devices, primarily, the silicon based MOSFET. This device scaling includes scaling the gate dielectric, which has primarily been fabricated using silicon dioxide. A thermally grown amorphous $SiO_2$ layer provides an electrically and thermodynamically stable material, where the interface of the $SiO_2$ layer with underlying silicon provides a high quality interface as well as superior electrical isolation properties. However, increased scaling and other requirements in microelectronic devices have created the need to use other dielectric materials as gate dielectrics.

DETAILED DESCRIPTION

Figure 1:
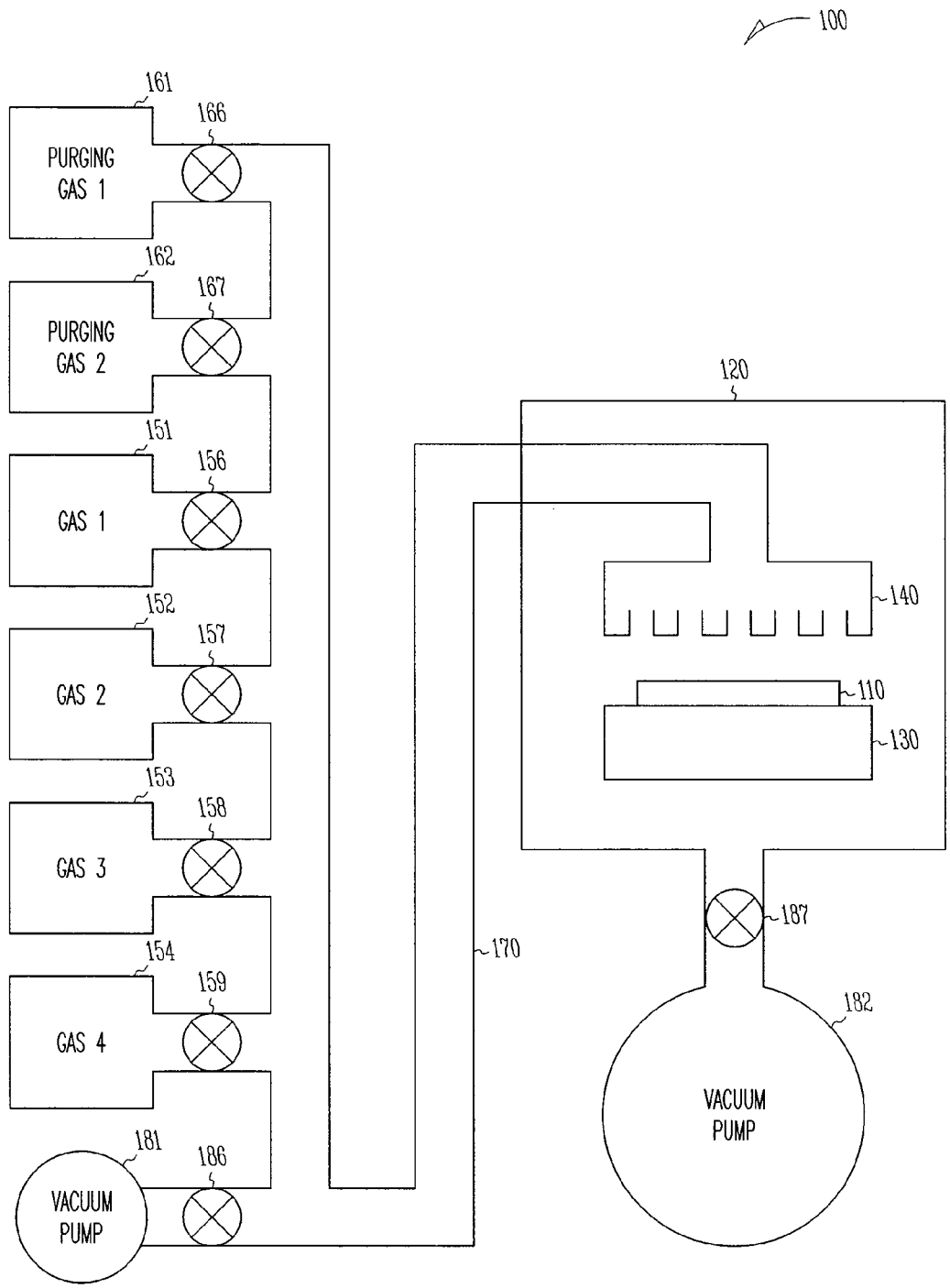
FIG. 1 depicts an atomic layer deposition system for fabricating a dielectric layer containing a lanthanum aluminum oxide layer, according to various embodiments.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms wafer and substrate used in the following description include any structure having an exposed surface with which to form an integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors and the term insulator or dielectric is defined to include any material that is less electrically conductive than the materials referred to as conductors or as semiconductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

A gate dielectric in a transistor has both a physical gate dielectric thickness and an equivalent oxide thickness ($t_{eq}$). The equivalent oxide thickness quantifies the electrical properties, such as capacitance, of the gate dielectric in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness to under 10 Å, the physical thickness requirement for a SiO$_2$ layer used for a gate dielectric would be need to be approximately 4 to 7 Å.

Additional requirements on a SiO$_2$ layer would depend on the gate electrode used in conjunction with the SiO$_2$ gate dielectric. Using a conventional polysilicon gate would result in an additional increase in $t_{eq}$ for the SiO$_2$ layer. This additional thickness could be eliminated by using a metal gate electrode, though metal gates are not currently used in typical complementary metal-oxide-semiconductor field effect transistor (CMOS) technology. Thus, future devices would be designed towards a physical SiO$_2$ gate dielectric layer of about 5 Å or less. Such a small thickness requirement for a SiO$_2$ oxide layer creates additional problems.

Silicon dioxide is used as a gate dielectric, in part, due to its electrical isolation properties in a SiO$_2$—Si based structure. This electrical isolation is due to the relatively large band gap of SiO$_2$ (8.9 eV) making it a good insulator from electrical conduction. Signification reductions in its band gap would eliminate it as a material for a gate dielectric. As the thickness of a SiO$_2$ layer decreases, the number of atomic layers, or monolayers of the material in the thickness decreases. At a certain thickness, the number of monolayers will be sufficiently small that the SiO$_2$ layer will not have a complete arrangement of atoms as in a larger or bulk layer. As a result of incomplete formation relative to a bulk structure, a thin SiO$_2$ layer of only one or two monolayers will not form a full band gap. The lack of a full band gap in a SiO$_2$ gate dielectric would cause an effective short between an underlying Si channel and an overlying polysilicon gate. This undesirable property sets a limit on the physical thickness to which a SiO$_2$ layer can be scaled. The minimum thickness due to this monolayer effect is thought to be about 7-8 Å. Therefore, for future devices to have a $t_{eq}$ less than about 10 Å, other dielectrics than SiO$_2$ need to be considered for use as a gate dielectric.

For a typical dielectric layer used as a gate dielectric, the capacitance is determined as one for a parallel plate capacitance: $C=\kappa\epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with SiO$_2$ having a dielectric constant $\kappa_{ox}=3.9$, as $$t=(\kappa/\kappa_{ox})t_{eq}=(\kappa/3.9)t_{eq}.$$

Thus, materials with a dielectric constant greater than that of SiO$_2$, 3.9, will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than SiO$_2$.

The thinner equivalent oxide thickness required for lower transistor operating voltages and smaller transistor dimensions may be realized by a significant number of materials, but additional fabricating requirements makes determining a suitable replacement for SiO$_2$ difficult. The current view for the microelectronics industry is still for Si based devices. This requires that the gate dielectric employed be grown on a silicon substrate or silicon layer, which places significant constraints on the substitute dielectric material. During the formation of the dielectric on the silicon layer, there exists the possibility that a small layer of SiO$_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the SiO$_2$ thickness and a multiplicative factor of the thickness, t, of the dielectric being formed, written as $$t_{eq}=t_{SiO_2}+\kappa_{ox}\kappa)t.$$

Thus, if a SiO$_2$ layer is formed in the process, the $t_{eq}$ is again limited by a SiO$_2$ layer. In the event that a barrier layer is formed between the silicon layer and the desired dielectric in which the barrier layer prevents the formation of a SiO$_2$ layer, the $t_{eq}$ would be limited by the layer with the lowest dielectric constant. However, whether a single dielectric layer with a high dielectric constant or a barrier layer with a higher dielectric constant than SiO$_2$ is employed, the layer interfacing with the silicon layer must provide a high quality interface to maintain a high channel carrier mobility.

One of the advantages using SiO$_2$ as a gate dielectric has been that the formation of the SiO$_2$ layer results in an amorphous gate dielectric. Having an amorphous structure for a gate dielectric provides for reducing problems of leakage current associated with grain boundaries in polycrystalline gate dielectrics that provide high leakage paths. Additionally, grain size and orientation changes throughout a polycrystalline gate dielectric can cause variations in the film's dielectric constant, along with uniformity and surface topography problems. Typically, materials having the advantage of a high dielectric constant relative to SiO$_2$ also have the disadvantage of a crystalline form, at least in a bulk configuration. The best candidates for replacing SiO$_2$ as a gate dielectric are those with high dielectric constant, which can be fabricated as a thin layer with an amorphous form.

Candidates to replace SiO$_2$ include high-$\kappa$ dielectric materials. High-$\kappa$ materials include materials having a dielectric constant greater than silicon dioxide, for example, dielectrics materials having a dielectric constant greater than about twice the dielectric constant of silicon dioxide. An appropriate high-$\kappa$ gate dielectric should have a large energy gap ($E_g$) and large energy barrier heights with Si for both electrons and holes. Generally, the bandgap is inversely related to the dielectric constant for a high-$\kappa$ material, which lessens some advantages of the high-$\kappa$ material. A set of high-$\kappa$ dielectric candidates for replacing silicon oxide as the dielectric material in electronic components in integrated circuit includes lanthanide oxides, HfO$_2$, ZrO$_2$, TiO$_2$, and other binary metal oxides.

Embodiments of dielectric layers containing an atomic layer deposited lanthanum aluminum oxide layer have a larger dielectric constant than silicon dioxide. Such dielectric layers provide a significantly thinner equivalent oxide thickness compared with a silicon oxide layer having the same physical thickness. Alternately, such dielectric layers provide a significantly thicker physical thickness than a silicon oxide layer having the same equivalent oxide thickness. This increased physical thickness aids in reducing leakage current.

In an embodiment, a lanthanum-metal oxide layer is formed in an integrated circuit by atomic layer deposition using a trisethylcyclopentadionatolanthanum (La(EtCp)$_3$) precursor to provide the lanthanum. In an embodiment, a lanthanum-metal oxide layer is formed in an integrated circuit by atomic layer deposition using a trisdipyvaloylmethanatolanthanum (La(DPM)$_3$) precursor to provide the lanthanum. In an embodiment, the lanthanum-metal oxide is a lanthanum aluminum oxide. A number of aluminum containing precursors may be used to provide aluminum for the lanthanum aluminum oxide layer. In an embodiment, a trimethylaluminum (TMA), $Al(CH_3)_3$, precursor may be used to deposit aluminum by atomic layer deposition. In an embodiment, a DMEAA (an adduct of alane ($AlH_3$) and dimethylethylamine $[N(CH_3)_2(C_2H_5)]$) precursor may be used to deposit aluminum by atomic layer deposition. In an embodiment, the lanthanum aluminum oxide may be formed substantially as stoichiometric lanthanum aluminum oxide. In an embodiment, the lanthanum aluminum oxide may be formed substantially as a non-stoichiometric lanthanum aluminum oxide or a combination of non-stoichiometric lanthanum aluminum oxide and stoichiometric lanthanum aluminum oxide. In an embodiment, the lanthanum aluminum oxide may be formed substantially as a compound of lanthanum oxide and aluminum oxide.

Another consideration for selecting the material and method for forming a dielectric film for use in electronic devices and systems concerns the roughness of a dielectric film on a substrate. Surface roughness of the dielectric film has a significant effect on the electrical properties of the gate oxide, and the resulting operating characteristics of the transistor. The leakage current through a physical 1.0 nm gate oxide increases by a factor of 10 for every 0.1 increase in the root-mean-square (RMS) roughness.

During a conventional sputtering deposition process stage, particles of the material to be deposited bombard the surface at a high energy. When a particle hits the surface, some particles adhere, and other particles cause damage. High energy impacts remove body region particles creating pits. The surface of such a deposited layer can have a rough contour due to the rough interface at the body region.

In an embodiment, a lanthanum aluminum oxide dielectric film having a substantially smooth surface relative to other processing techniques is formed using atomic layer deposition (ALD). Further, forming such a dielectric film using atomic layer deposition can provide for controlling transitions between material layers. As a result of such control, atomic layer deposited lanthanum aluminum oxide dielectric films can have an engineered transition with a substrate surface.

ALD, also known as atomic layer epitaxy (ALE), is a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber is purged with a gas, which in many cases is an inert gas, and/or evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other on the substrate aggressively, one ALD cycle can be performed in less than one second in properly designed flow type reaction chambers. Typically, precursor pulse times range from about 0.5 sec to about 2 to 3 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Significantly, ALD provides for controlling film thickness in a straightforward manner by controlling the number of growth cycles.

ALD was originally developed to manufacture luminescent and dielectric films needed in electroluminescent displays. Significant efforts have been made to apply ALD to the growth of doped zinc sulfide and alkaline earth metal sulfide films. Additionally, ALD has been studied for the growth of different epitaxial II-V and II-VI films, nonepitaxial crystalline or amorphous oxide and nitride films and multilayer structures of these. There also has been considerable interest towards the ALD growth of silicon and germanium films, but due to the difficult precursor chemistry, this has not been very successful.

The precursors used in an ALD process may be gaseous, liquid or solid. However, liquid or solid precursors should be volatile. The vapor pressure should be high enough for effective mass transportation. In addition, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used though evaporation rates may somewhat vary during the process because of changes in their surface area.

There are several other characteristics for precursors used in ALD. The precursors should be thermally stable at the substrate temperature because their decomposition would destroy the surface control and accordingly the advantages of the ALD method that relies on the reaction of the precursor at the substrate surface. A slight decomposition, if slow compared to the ALD growth, can be tolerated.

The precursors should chemisorb on or react with the surface, though the interaction between the precursor and the surface as well as the mechanism for the adsorption is different for different precursors. The molecules at the substrate surface should react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction should be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that are all identical in chemical kinetics, deposition per cycle, composition, and thickness. RS-ALD sequences generally deposit less than a full layer per cycle.

Typically, a deposition or growth rate of about 0.25 to about 2.00 Å per RS-ALD cycle can be realized.

The advantages of RS-ALD include continuity at an interface avoiding poorly defined nucleating regions that are typical for chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with resolution of one to two monolayers. RS-ALD processes allows for deposition control on the order on monolayers and the ability to deposit monolayers of amorphous films.

Herein, a sequence refers to the ALD material formation based on an ALD reaction of a precursor followed by its reactant precursor. For example, forming lanthanum oxide from a La(thd)$_3$ (thd=2,2,6,6-tetramethyl-3,5-heptanedione) precursor and ozone, as its reactant precursor, forms an embodiment of a lanthanum/oxygen sequence, which can also be referred to as a lanthanum sequence. A cycle of a sequence includes pulsing a precursor, pulsing a purging gas for the precursor, pulsing a reactant precursor, and pulsing the reactant's purging gas. However, in forming a layer of a metal species, an ALD sequence deals with reacting a precursor containing the metal species with a substrate surface. A cycle for such a metal forming sequence includes pulsing a purging gas after pulsing the precursor containing the metal species.

An embodiment for a method of forming an electronic device includes forming a dielectric layer containing a lanthanum-metal oxide layer formed by atomic layer deposition, in which the lanthanum-metal oxide includes one or more metals other than lanthanum. In various embodiments, the atomic layer deposition process uses a trisethylcyclopentadionatolanthanum precursor and/or a trisdipyvaloylmethanatolanthanum precursor to deposit lanthanum. Embodiments include a lanthanum aluminum oxide layer. Embodiments include structures for capacitors, transistors, memory devices, and electronic systems with dielectric layers containing an atomic layer deposited lanthanum aluminum oxide layer, and methods for forming such structures.

In an embodiment, a layer of lanthanum aluminum oxide is formed on a substrate mounted in a reaction chamber using ALD in repetitive sequences using precursor gases individually pulsed into the reaction chamber. An embodiment includes forming the lanthanum aluminum oxide using a La(EtCp)$_3$ precursor gas. Alternately, the lanthanum aluminum oxide layer may be formed by atomic layer deposition using a La(DPM)$_3$ precursor gas. Other solid or liquid precursors may be used in an appropriately designed reaction chamber.

FIG. 1 shows an embodiment of an atomic layer deposition system 100 for processing a dielectric film containing lanthanum aluminum oxide. The elements depicted permit discussion of various embodiments such that those skilled in the art may practice similar embodiments without undue experimentation. In FIG. 1, a substrate 110 is located inside a reaction chamber 120 of ALD system 100. Also located within the reaction chamber 120 is a heating element 130, which is thermally coupled to substrate 110 to control the substrate temperature. A gas-distribution fixture 140 introduces precursor gases to the substrate 110. Each precursor gas originates from individual gas sources 151-154, whose flow is controlled by mass-flow controllers 156-159, respectively. Gas sources 151-154 provide a precursor gas either by storing the precursor as a gas or by providing a location and apparatus for evaporating a solid or liquid material to form the selected precursor gas.

Also included in the ALD system are purging gas sources 161, 162, each of which is coupled to mass-flow controllers 166, 167, respectively. Furthermore, additional purging gas sources can be constructed in ALD system 100, one purging gas source for each precursor gas, for example. For a process that uses the same purging gas for multiple precursor gases less purging gas sources are required for ALD system 100. Gas sources 151-154 and purging gas sources 161-162 are coupled by their associated mass-flow controllers to a common gas line or conduit 170, which is coupled to the gas-distribution fixture 140 inside the reaction chamber 120. Gas conduit 170 is also coupled to vacuum pump, or exhaust pump, 181 by mass-flow controller 186 to remove excess precursor gases, purging gases, and by-product gases at the end of a purging sequence from the gas conduit.

Vacuum pump, or exhaust pump, 182 is coupled by mass-flow controller 187 to remove excess precursor gases, purging gases, and by-product gases at the end of a purging sequence from reaction chamber 120. For convenience, control displays, mounting apparatus, temperature sensing devices, substrate maneuvering apparatus, and necessary electrical connections as are known to those skilled in the art are not shown in FIG. 1. Though ALD system 100 is well suited for performing various embodiments, other ALD systems commercially available can be used.

The use, construction and fundamental operation of reaction chambers for deposition of films are understood by those of ordinary skill in the art of semiconductor fabrication. Embodiments may be practiced on a variety of such reaction chambers without undue experimentation. Furthermore, one of ordinary skill in the art will comprehend the necessary detection, measurement, and control techniques in the art of semiconductor fabrication upon reading the disclosure.

The elements of ALD system 100 can be controlled by a computer. To focus on the use of ALD system 100 in the various embodiments, the computer is not shown. Those skilled in the art can appreciate that the individual elements such as pressure control, temperature control, and gas flow within ALD system 100 can be under computer control.

Figures 2, 3:
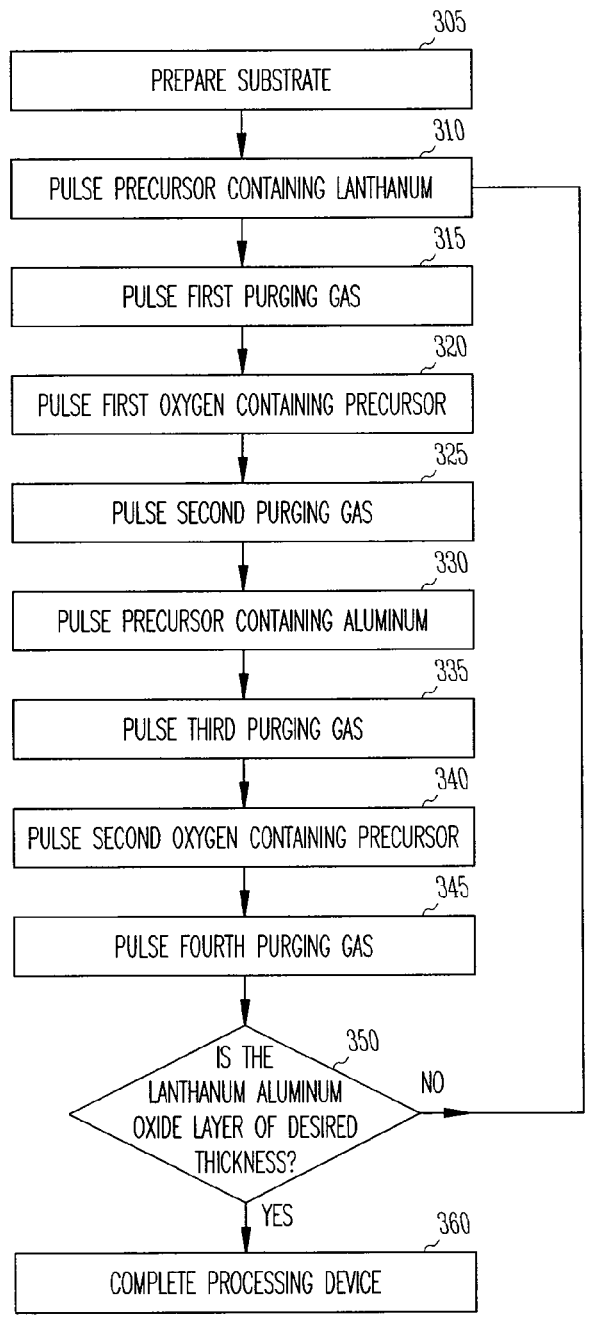
FIG. 2 illustrates a flow diagram of elements for an embodiment of a method to form a dielectric layer containing a lanthanum aluminum oxide layer by atomic layer deposition.
FIG. 3 illustrates a flow diagram of elements for an embodiment of a method to form a dielectric layer containing a lanthanum aluminum oxide layer by atomic layer deposition.

FIG. 2 illustrates a flow diagram of elements for an embodiment of a method to form a dielectric layer containing a lanthanum aluminum oxide layer using atomic layer deposition. At 210, in an atomic layer deposition process a La(EtCp)$_3$ precursor is pulsed to deposit lanthanum on a substrate surface of an integrated circuit. Alternately, a La(DPM)$_3$ precursor may be pulsed to deposit lanthanum on the substrate surface. La(EtCp)$_3$ has a melting point of about 95° C. and has a vapor pressure that is significantly higher than the vapor pressure of La(DPM)$_3$. The use of La(EtCp)$_3$ and/or La(DPM)$_3$ as the lanthanum containing precursor may depend on the application of the electronic device being fabricated. In addition, the pulsing of the lanthanum precursor may use a pulsing period that provides uniform coverage of a monolayer on the surface or may use a pulsing period that provides partial formation of a monolayer on the surface during a lanthanum sequence.

At 220, an aluminum containing precursor is pulsed. In an embodiment, an TMA precursor may be used to deposit aluminum by atomic layer deposition. In an embodiment, a DMEAA precursor may be used to deposit aluminum by atomic layer deposition. The aluminum may be deposited before depositing lanthanum in an atomic layer deposition process for forming a lanthanum aluminum oxide. In addition, the pulsing of the aluminum precursor may use a pulsing period that provides uniform coverage of a monolayer on the surface or may use a pulsing period that provides partial formation of a monolayer on the surface during an aluminum sequence.

In an alternate embodiment, a lanthanum-metal oxide may be formed by atomic layer deposition in which the lanthanum-metal oxide includes lanthanum and one or more other metals. Such an oxide may be in a stoichiometric form, a non-stoichiometric form, or a combination of stoichiometric and non-stoichiometric form. The lanthanum-metal oxide made be formed by pulsing a La(EtCp)$_3$ precursor and/or La(DPM)$_3$ precursor, as at 210, which is followed by pulsing a precursor containing the metal for the lanthanum-metal oxide. If multiple metal species are to be formed in the lanthanum-metal oxide, multiple ALD sequences may be performed using a different metal containing precursor for each of the different metal species sequences.

In an embodiment, a lanthanum aluminum oxide may be formed substantially as stoichiometric lanthanum aluminum oxide such as LaAlO$_3$. In an embodiment, a lanthanum aluminum oxide may be formed substantially as a non-stoichiometric lanthanum aluminum oxide (represented as La$_x$Al$_{1-x}$O$_y$) or a combination of non-stoichiometric lanthanum aluminum oxide and stoichiometric lanthanum aluminum oxide. In an embodiment, a lanthanum aluminum oxide may be formed substantially as a compound of lanthanum oxide and aluminum oxide such as (La$_2$O$_3$)$_x$(Al$_2$O$_3$)$_{1-x}$. In an embodiment, a dielectric layer containing a lanthanum aluminum oxide layer may be formed substantially as a lanthanum aluminum oxide layer. Alternately, the dielectric layer may be forming containing the atomic layer deposited lanthanum aluminum oxide layer and one or more layers of other dielectric materials including, but not limited to, dielectric nitrides, dielectric metal silicates, dielectric metal oxides including Al$_2$O$_3$, La$_2$O$_3$, and other lanthanide oxides such as La$_2$O$_3$, Pr$_2$O$_3$, Nd$_2$O$_3$, Sm$_2$O$_3$, Gd$_2$O$_3$, Dy$_2$O$_3$, Ce$_2$O$_3$, Tb$_2$O$_3$, Er$_2$O$_3$, Eu$_2$O$_3$, Lu$_2$O$_3$, Tm$_2$O$_3$, Ho$_2$O$_3$, Pm$_2$O$_3$, and Yb$_2$O$_3$. These one or more other layers of lanthanide oxides may be provided in stoichiometric form, in non-stoichiometric form, or a combination of stoichiometric lanthanide oxides and non-stoichiometric lanthanide oxides. In an embodiment, a dielectric layer containing a lanthanum aluminum oxide may include dielectric layers of non-lanthanide oxides.

FIG. 3 illustrates a flow diagram of elements for an embodiment of a method to form a dielectric layer containing an atomic layer deposited lanthanum aluminum oxide layer. This embodiment can be implemented with the atomic layer deposition system 100 of FIG. 1. At 305, a substrate 110 is prepared. The substrate used for forming a transistor is typically a silicon or silicon containing material. In other embodiments, germanium, gallium arsenide, silicon-on-sapphire substrates, or other suitable substrates may be used. This preparation process includes cleaning substrate 110 and forming layers and regions of the substrate, such as drains and sources of a metal oxide semiconductor (MOS) transistor, prior to forming a gate dielectric. Alternately, these active regions may be formed after forming the dielectric layer, depending on the over-all fabrication process implemented. In an embodiment, the substrate is cleaned to provide an initial substrate depleted of its native oxide. In an embodiment, the initial substrate is cleaned also to provide a hydrogen-terminated surface. In an embodiment, a silicon substrate undergoes a final hydrofluoric (HF) rinse prior to ALD processing to provide the silicon substrate with a hydrogen-terminated surface without a native silicon oxide layer.

Cleaning immediately preceding atomic layer deposition aids in reducing an occurrence of silicon oxide as an interface between a silicon based substrate and a lanthanum aluminum oxide dielectric formed using the atomic layer deposition process. The material composition and its properties of an interface layer are typically dependent on process conditions and the condition of the substrate before forming the dielectric layer. Though the existence of an interface layer may effectively reduce the dielectric constant associated with the dielectric layer and its substrate interface layer, a SiO$_2$ interface layer or other composition interface layer, may improve the interface density, fixed charge density, and channel mobility of a device having this interface layer.

The sequencing of the formation of the regions of the transistor being processed may follow typical sequencing that is generally performed in the fabrication of a MOS transistor as is well known to those skilled in the art. Included in the processing prior to forming a gate dielectric is the masking of substrate regions to be protected during the gate dielectric formation, as is typically performed in MOS fabrication. In this embodiment, the unmasked region includes a body region of a transistor, however one skilled in the art will recognize that other semiconductor device structures may utilize this process. Additionally, the substrate 110 in its ready for processing form is conveyed into a position in reaction chamber 120 for ALD processing.

At 310, a lanthanum containing precursor such as a La(EtCp)$_3$ precursor is pulsed into reaction chamber 120. The La(EtCp)$_3$ is pulsed into reaction chamber 120 through the gas-distribution fixture 140 onto substrate 110. The flow of the La(EtCp)$_3$ is controlled by mass-flow controller 156 from gas source 151, where the La(EtCp)$_3$ is maintained. In an embodiment, the substrate temperature is maintained at temperature ranging from about 400° C. to about 650° C. In an embodiment, the substrate temperature is maintained at about 650° C. Alternately, the substrate temperature may be maintained at temperatures less than 650° C. by heating element 130. The La(EtCp)$_3$ reacts with the surface of the substrate 110 in the desired region defined by the unmasked areas of the substrate 110. In other embodiments, La(DPM)$_3$ is used as a lanthanum containing precursor. In an embodiment, H$_2$ may be pulsed along with the La(EtCp)$_3$ precursor or the La(DPM)$_3$ precursor to reduce carbon contamination in the deposited film.

At 315, a first purging gas is pulsed into the reaction chamber 120. In an embodiment, nitrogen is used as a purging gas and a carrier gas. The nitrogen flow is controlled by mass-flow controller 166 from the purging gas source 161 into the gas conduit 170. Using the pure nitrogen purge avoids overlap of the precursor pulses and possible gas phase reactions. In an embodiment, argon gas or other inert gas may be used as the purging gas. Following the purge, an first oxygen containing precursor is pulsed into the reaction chamber 120, at 320.

For the lanthanum sequence using La(EtCp)$_3$ or La(DPM)$_3$ as the precursor, water vapor may be selected as the precursor acting as a reactant to deposit lanthanum and oxygen on the substrate 110. The H$_2$O vapor is pulsed into the reaction chamber 120 through gas conduit 170 from gas source 152 by mass-flow controller 157. The water vapor aggressively reacts at the surface of substrate 110.

Following the pulsing of the first oxygen containing precursor, a second purging gas is injected into the reaction chamber 120, at 325. Nitrogen gas may be used to purge the reaction chamber after pulsing each precursor gas in the lanthanum/oxygen sequence. In an embodiment, argon gas or other inert gas may be used as the purging gas. Excess precursor gas, and reaction by-products are removed from the system by the purge gas in conjunction with the exhausting of the reaction chamber 120 using vacuum pump 182 through mass-flow controller 187, and exhausting of the gas conduit 170 by the vacuum pump 181 through mass-flow controller 186.

At 330, a precursor containing aluminum is pulsed into reaction chamber 120. In an embodiment, TMA is used as the aluminum containing precursor. The TMA is pulsed to the surface of the substrate 110 through gas-distribution fixture 140 from gas source 153 by mass-flow controller 158. The TMA is introduced onto the lanthanum and oxygen formed during the lanthanum sequence. As an alternate aluminum sequence, a DMEAA precursor may be employed. During pulsing of the aluminum containing precursor, the substrate may be held between about 350° C. and about 450° C. by the heating element 130.

At 335, a third purging gas is introduced into the system. In an embodiment following a TMA precursor, purified argon may be used as a purging and carrier gas. Alternately, nitrogen may be used as a purging gas. The flow of the third purging gas is controlled by mass-flow controller 167 from the purging gas source 162 into the gas conduit 170 and subsequently into the reaction chamber 120. In an embodiment, hydrogen may be used as the purging and carrier gas for DMEAA as the aluminum containing precursor.

At 340, a second oxygen containing precursor is pulsed into the reaction chamber 120. For the aluminum sequence using TMA or DMEAA as the precursor, water vapor may be used as the precursor acting as an oxidizing reactant to interact at the substrate 110. The water vapor is pulsed into the reaction chamber 120 through gas conduit 170 from gas source 154 by mass-flow controller 159. The water vapor aggressively reacts at the surface of substrate 110 to form a lanthanum aluminum oxide.

At 345, a fourth purging gas is injected into the reaction chamber 200. In an embodiment, argon gas is used as the fourth purging gas to purge the reaction chamber. Alternately, nitrogen or hydrogen may be used as the fourth purging gas. Excess precursor gas, and reaction by-products are removed from the system by the purge gas in conjunction with the exhausting of the reaction chamber 120 using vacuum pump 182 through mass-flow controller 187, and exhausting of the gas conduit 170 by the vacuum pump 181 through mass-flow controller 186.

At 350, it is determined whether the lanthanum aluminum oxide film is of the desired thickness, t. The thickness of a lanthanum aluminum oxide film after one cycle is determined by the pulsing periods used in the lanthanum sequence and the aluminum sequence at a given temperature. Typically, at a given temperature, the pulsing periods can vary over a significant range above some minimum pulse time for the precursors, without substantially altering the growth rate. Once a set of periods for one cycle is determined, the growth rate for the lanthanum aluminum oxide film will be set at a value such as N nm/cycle. For a desired lanthanum aluminum oxide film thickness in an application such as forming a gate dielectric of a MOS transistor, the ALD process should be repeated for t/N cycles. The desired thickness should be completed after t/N cycles. If less than t/N cycles have been completed, the process starts over at 310 with the pulsing of the precursor containing lanthanum. If t/N cycles have completed, no further ALD processing is requires and the lanthanum aluminum oxide film is completed. Once the total number of cycles to form the desired thickness has been completed, the dielectric film containing the lanthanum aluminum oxide layer may optionally be annealed.

At 360, after forming the lanthanum aluminum oxide layer, processing the device having the dielectric layer containing lanthanum aluminum oxide layer is completed. In an embodiment, completing the device includes further processing of the dielectric layer to include layers of other dielectric materials. In an embodiment, completing the device includes completing the formation of a transistor. In another embodiment, completing the device includes completing the formation of a capacitor. Alternately, completing the process includes completing the construction of a memory device having an array with access transistors formed with gate dielectrics containing atomic layer deposited lanthanum aluminum oxide layer. Further, in another embodiment, completing the process includes the formation of an electronic system including an information handling device that uses electronic devices with transistors formed with dielectric films containing an atomic layer deposited lanthanum aluminum oxide layer. Typically, information handling devices such as computers include many memory devices, having many access transistors.

Embodiments for methods having elements similar to the embodiment of FIG. 3 may include numerous permutations for forming the lanthanum aluminum oxide layer. In an embodiment, the aluminum sequence is conducted before the lanthanum sequence. In an embodiment, a lanthanum/aluminum cycle may include a number, x, of lanthanum sequences and a number, y, of aluminum sequences. The number of sequences x, y may be selected to engineer the relative amounts of lanthanum to aluminum. In an embodiment, the number of sequences x and y, along with associated pulsing periods and times, is selected to form a lanthanum aluminum oxide with substantially equal amounts of lanthanum and aluminum. In an embodiment, the number of sequences is selected with x=y. In an embodiment, the number of sequences x and y are selected to form a lanthanum-rich lanthanum aluminum oxide. Alternately, the number of sequences x and y are selected to form an aluminum-rich lanthanum aluminum oxide.

In an embodiment, the lanthanum aluminum oxide layer may be doped with other lanthanides such as Pr, N, Sm, Gd, Dy, Ce, Tb, Er, Eu, Lu, Tm, Ho, Pm, and Yb. The doping may be employed to enhance the leakage current characteristics of the dielectric layer containing the lanthanum aluminum oxide by providing a disruption or perturbation of the lanthanum aluminum oxide structure. Such doping may be realized by substituting a sequence of one of these lanthanides for a lanthanum sequence or an aluminum sequence. The choice for substitution may depend on the form of the lanthanum aluminum oxide structure with respect to the ratio of lanthanum atoms to aluminum desired in the oxide. To maintain a substantially lanthanum aluminum oxide, the amount of alternate lanthanides doped into the oxide may be limited to a relatively small fraction of the total number of lanthanum and aluminum atoms. Such a fraction may be 10 percent or less. In an embodiment, to maintain a substantially lanthanum aluminum oxide, the amount of alternate lanthanides doped into the oxide may be limited to a relatively small fraction of the lanthanum or the aluminum atoms based on which material is selected to have the smallest number of atoms. Such a fraction may be 10 percent or less.

The embodiments described herein provide a process for growing a dielectric film having a wide range of useful equivalent oxide thickness, $t_{eq}$, associated with a dielectric constant in the range from about 9 to about 30. This range of dielectric constants provides for a $t_{eq}$ ranging from about 13% to about 43% relative to a given silicon dioxide thickness. In an embodiment, a dielectric layer containing a lanthanum aluminum oxide layer has a $t_{eq}$ ranging from about 5 Å to about 20 Å. In an embodiment, a dielectric layer containing a lanthanum aluminum oxide layer has a $t_{eq}$ of less than 5 Å. Alternately, for an acceptable silicon dioxide thickness, an embodiment for a lanthanum aluminum oxide may include a thickness ranging from greater than two to less than eight times that of the acceptable silicon dioxide thickness providing enhanced probability for reducing leakage current. In an embodiment, a lanthanum aluminum oxide film is formed with a thickness ranging from two to three monolayers to a hundred angstroms. Further, dielectric films of lanthanum aluminum oxide layer formed by atomic layer deposition can provide not only thin $t_{eq}$ films, but also films with relatively low leakage current. Additionally, the novel process can be implemented to form transistors, capacitors, memory devices, and other electronic systems including information handling devices.

Figure 4:
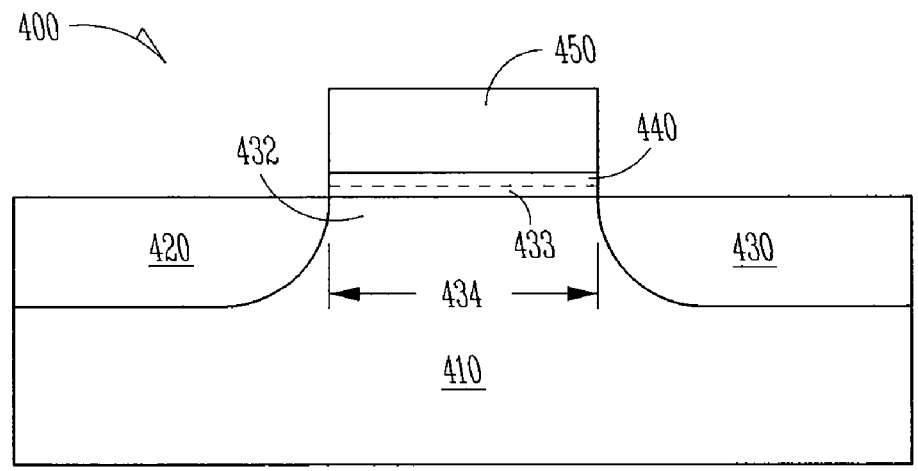
FIG. 4 shows an embodiment of a configuration of a transistor having a dielectric layer containing an atomic layer deposited lanthanum aluminum oxide layer.

A transistor 400 as depicted in FIG. 4 may be constructed including using an embodiment for forming a dielectric layer containing a lanthanum aluminum oxide layer by atomic layer deposition. Transistor 400 includes a source region 420 and a drain region 430 in a silicon based substrate 410 where source and drain regions 420, 430 are separated by a body region 432. Body region 432 defines a channel having a channel length 434. A dielectric layer is disposed on substrate 410 formed as a dielectric layer containing lanthanum aluminum oxide on substrate 410 by atomic layer deposition. The resulting dielectric layer forms gate dielectric 440. Gate dielectric 440 may be realized as a dielectric layer formed substantially of lanthanum aluminum oxide. Gate dielectric 440 may contain one or more insulating layers in which at least one layer is a lanthanum aluminum oxide layer. A gate 450 is formed over and contacts gate dielectric 440.

An interfacial layer 433 may form between body region 432 and gate dielectric 440. In an embodiment, interfacial layer 433 may be limited to a relatively small thickness compared to gate dielectric 440, or to a thickness significantly less than gate dielectric 440 as to be effectively eliminated. Interfacial layer 433 may be formed as a lanthanum silicate, an aluminum silicate, or a lanthanum aluminum silicate. Forming the substrate, the gate, and the source and drain regions may be performed using standard processes known to those skilled in the art. Additionally, the sequencing of the various elements of the process for forming a transistor may be conducted with standard fabrication processes, also as known to those skilled in the art. In an embodiment, gate dielectric 440 may be realized as a gate insulator in a silicon CMOS transistor. Transistor 400 is not limited to silicon based substrates, but may be used with a variety of semiconductor substrates.

Figure 5:
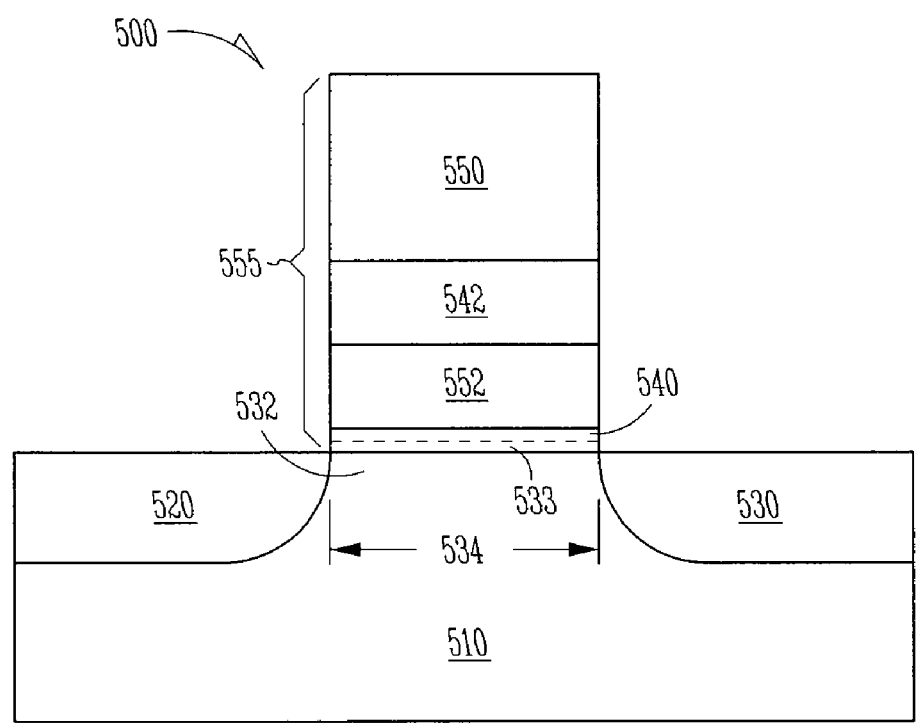
FIG. 5 shows an embodiment of a configuration of a floating gate transistor having a dielectric layer containing an atomic layer deposited lanthanum aluminum oxide layer.

FIG. 5 shows an embodiment of a configuration of a floating gate transistor 500 having an embodiment of an atomic layer deposited lanthanum aluminum oxide layer dielectric film. Transistor 500 includes a silicon based substrate 510 with a source 520 and a drain 530 separated by a body region 532. However, transistor 500 is not limited to silicon based substrates, but may be used with a variety of semiconductor substrates. Body region 532 between source 520 and drain 530 defines a channel region having a channel length 534. Located above body region 532 is a stack 555 including a gate dielectric 540, a floating gate 552, a floating gate dielectric 542, and a control gate 550. An interfacial layer 533 may form between body region 532 and gate dielectric 540. In an embodiment, interfacial layer 533 may be limited to a relatively small thickness compared to gate dielectric 540, or to a thickness significantly less than gate dielectric 540 as to be effectively eliminated.

Gate dielectric 540 includes a dielectric containing an atomic layer deposited lanthanum aluminum oxide layer formed in embodiments similar to those described herein. Gate dielectric 540 may be realized as a dielectric layer formed substantially of lanthanum aluminum oxide. Gate dielectric 540 may include one or more dielectric layers in which at least one layer is a lanthanum aluminum oxide layer. In an embodiment, floating gate 552 is formed over and contacts gate dielectric 540.

In an embodiment, floating gate dielectric 542 includes a dielectric containing an atomic layer deposited lanthanum aluminum oxide layer formed in embodiments similar to those described herein. Floating gate dielectric 542 may be realized as a dielectric layer formed substantially of lanthanum aluminum oxide. Floating gate dielectric 542 may be include one or more insulating layers in which at least one layer is a lanthanum aluminum oxide layer. In an embodiment, control gate 550 is formed over and contacts floating gate dielectric 542.

Alternately, both gate dielectric 540 and floating gate dielectric 542 may be formed as dielectric layers containing an atomic layer deposited lanthanum aluminum oxide layer. Floating gate 552 and floating gate dielectric 542 may be realized by embodiments similar to those described herein with the remaining elements of the transistor 500 formed using processes known to those skilled in the art. In an embodiment, gate dielectric 540 forms a tunnel gate insulator and floating gate dielectric 542 forms an inter-gate insulator in flash memory devices, where gate dielectric 540 and/or floating gate dielectric 542 include an atomic layer deposited lanthanum aluminum oxide film. Use of dielectric layers containing an atomic layer deposited lanthanum aluminum oxide layer for a gate dielectric and/or floating gate dielectric is not limited to silicon based substrates, but may be used with a variety of semiconductor substrates.

Figure 6:
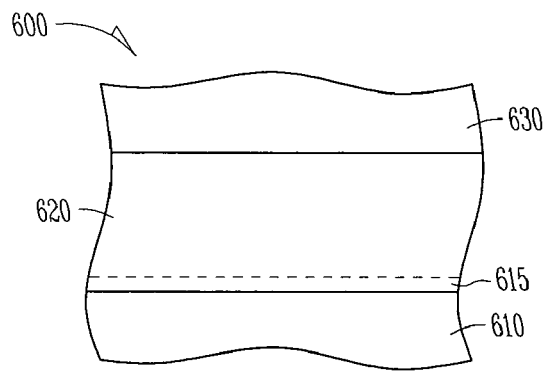
FIG. 6 shows an embodiment of a configuration of a capacitor having a dielectric layer containing an atomic layer deposited lanthanum aluminum oxide layer.

Embodiments of methods for forming dielectric layers containing an atomic layer deposited lanthanum aluminum oxide layer may also be applied to forming capacitors in various integrated circuits, memory devices, and electronic systems. In an embodiment for forming a capacitor 600 illustrated in FIG. 6, a method includes forming a first conductive layer 610, forming a dielectric layer 620 containing an atomic layer deposited lanthanum aluminum oxide layer on first conductive layer 610, and forming a second conductive layer 630 on dielectric layer 620. Dielectric layer 620 containing lanthanum aluminum oxide layer may be formed using any of the embodiments described herein. An interfacial layer 615 may form between first conductive layer 610 and dielectric layer 620. In an embodiment, interfacial layer 615 may be limited to a relatively small thickness compared to dielectric layer 620, or to a thickness significantly less than dielectric layer 620 as to be effectively eliminated.

Dielectric layer 620 may be realized as a dielectric layer formed substantially of lanthanum aluminum oxide. Dielectric layer 620 may include one or more insulating layers in which at least one layer is substantially lanthanum aluminum oxide. In an embodiment, dielectric layer 620 containing a lanthanum aluminum oxide layer may include a lanthanide oxide layer contacting first conductive layer 610 or second conductive layer 630. Alternately, dielectric layer 620 containing a lanthanum aluminum oxide layer may include two lanthanide oxide layers, one contacting first conductive layer 610 and one contacting second conductive layer 630. However, lanthanide oxide dielectrics on a silicon substrate tend to lead to large flatband voltage shifts, which may be attributed to fixed oxide charges located near the interface between the lanthanide oxide layer and the silicon. The source of this fixed oxide charge may be due to an interface reaction of a metal gate, such as aluminum, with the lanthanum aluminum oxide on which the metal gate is disposed. This metal gate interface reaction may induce a portion of the fixed oxide charges. In an embodiment, a ruthenium metal layer, such as for a capacitor electrode, may be used to avoid or prevent a reaction between the gate metal and the lanthanide oxide layer used as a top layer or a bottom layer of dielectric layer 620. Generally, ruthenium is more inert than polysilicon and metals such as aluminum and tantalum, has a resistivity as low as 7.5 $\mu\Omega$cm, and has a melting point of 2450° C. In an embodiment, a conductive ruthenium oxide layer may be used as a conductive contact layer. The ruthenium metal layer and/or conductive ruthenium oxide layer may be deposited using physical vapor deposition, evaporation, sputtering, chemical vapor deposition, or metalorganic chemical vapor deposition. In an embodiment, second conductive layer 630 and/or first conductive layer 610 contain ruthenium and/or conductive ruthenium oxide. In an embodiment, second conductive layer 630 and/or first conductive layer 610 are formed substantially of a ruthenium metal. Alternately, second conductive layer 630 and/or first conductive layer 610 are formed substantially of conductive ruthenium oxide.

Embodiments for dielectric layer 620 containing an atomic layer deposited lanthanum aluminum oxide layer in a capacitor includes, but is not limited to, dielectrics in DRAM capacitors and dielectrics in capacitors in analog, radio frequency (RF), and mixed signal integrated circuits. As can be understood by those skilled in the art, in various embodiments for dielectric layer containing an atomic layer deposited lanthanum aluminum oxide layer and outer lanthanide layers, a ruthenium metal layer may be disposed on an outer lanthanide oxide layer as an electrode, gate, or direct conductive contact depending on the application of the lanthanum aluminum oxide dielectric as a various components of an electronic device in an integrated circuit and not limited to capacitors.

Various embodiments for a dielectric film containing atomic layer deposited lanthanum aluminum oxide may provide for enhanced device performance by providing devices with reduced leakage current. Such improvements in leakage current characteristics may be attained by forming one or more layers of an atomic layer deposited lanthanum aluminum oxide in a nanolaminate structure with other metal oxides including other lanthanide oxides and/or with other non-metal containing dielectrics. The transition from one layer of the nanolaminate to another layer of the nanolaminate provides further disruption to a tendency for an ordered structure in the nanolaminate stack. The term "nanolaminate" means a composite film of ultra thin layers of two or more materials in a layered stack, where the layers are alternating layers of materials of the composite film. Typically, each layer in a nanolaminate has a thickness of an order of magnitude in the nanometer range. Further, each individual material layer of the nanolaminate can have a thickness as low as a monolayer of the material or as high as 20 nanometers. In an embodiment, a nanolaminate contains alternating layers of lanthanum aluminum oxide and a lanthanide oxide. In an embodiment, a nanolaminate contains alternating layers of lanthanum aluminum oxide and aluminum oxide. In an embodiment, a nanolaminate contains alternating layers of lanthanum aluminum oxide, a lanthanide oxide, and aluminum lanthanum oxide.

Figure 7:
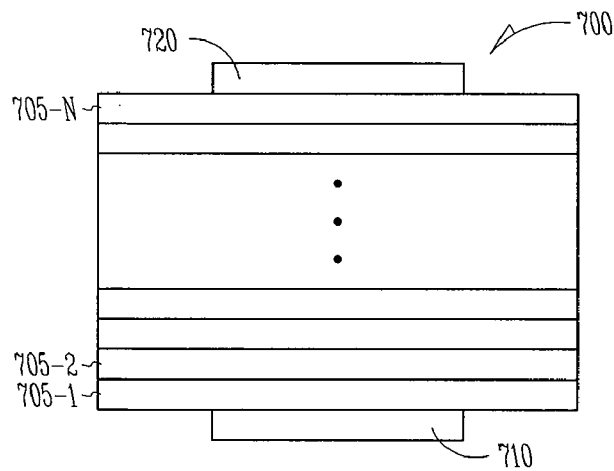
FIG. 7 depicts an embodiment of a dielectric layer including a nanolaminate having at least one layer containing an atomic layer deposited lanthanum aluminum oxide layer.

FIG. 7 depicts a nanolaminate structure 700 for an embodiment of a dielectric structure including an atomic layer deposited lanthanum aluminum oxide layer dielectric film. Nanolaminate structure 700 includes a plurality of layers 705-1, 705-2 to 705-N, where at least one layer contains a lanthanum aluminum oxide layer formed by atomic layer deposition using a La(EtCp)$_3$ precursor or a La(DPM)$_3$ precursor. The other layers may be other dielectric layers or dielectric metal oxides including oxides of lanthanides La, Pr, Nd, Sm, Gd, Dy, Ce, Tb, Er, Eu, Lu, Tm, Ho, Pm, and/or Yb in stoichiometric form or in non-stoichiometric form. The sequencing of the layers depends on the application. The effective dielectric constant associated with nanolaminate structure 700 is that attributable to N capacitors in series, where each capacitor has a thickness defined by the thickness of the corresponding layer. By selecting each thickness and the composition of each layer, a nanolaminate structure can be engineered to have a predetermined dielectric constant. In an embodiment, nanolaminate structure 700 has conductive contacts 710 and 720 to provide electrical conductivity to the electronic device structure in which it is formed. Embodiments for structures such as nanolaminate structure 700 may be used as nanolaminate dielectrics in NROM flash memory devices as well as other integrated circuits.

Transistors, capacitors, and other devices having dielectric films containing atomic layer deposited lanthanum aluminum oxide layer formed by the methods described above may be implemented into memory devices and electronic systems including information handling devices. Embodiments of these information handling devices may include wireless systems, telecommunication systems, and computers. Further, embodiments of electronic devices having dielectric films containing an atomic layer deposited lanthanum aluminum oxide layer may be realized as integrated circuits.

Figure 8:
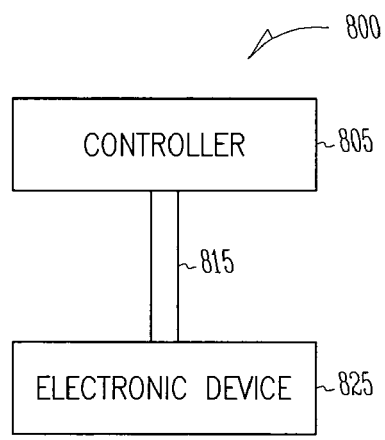
FIG. 8 is a simplified diagram for an embodiment of a controller coupled to an electronic device having a dielectric layer containing an atomic layer deposited lanthanum aluminum oxide layer.

FIG. 8 illustrates a diagram for an electronic system 800 having one or more devices having a dielectric layer containing an atomic layer deposited lanthanum aluminum oxide layer formed according to various embodiments. Electronic system 800 includes a controller 805, a bus 815, and an electronic device 825, where bus 815 provides electrical conductivity between controller 805 and electronic device 825. In various embodiments, controller 805 and/or electronic device 825 include an embodiment for a dielectric layer containing an atomic layer deposited lanthanum aluminum oxide layer as previously discussed herein. Electronic system 800 may include, but is not limited to, information handling devices, wireless systems, telecommunication systems, fiber optic systems, electro-optic systems, and computers.

Figure 9:
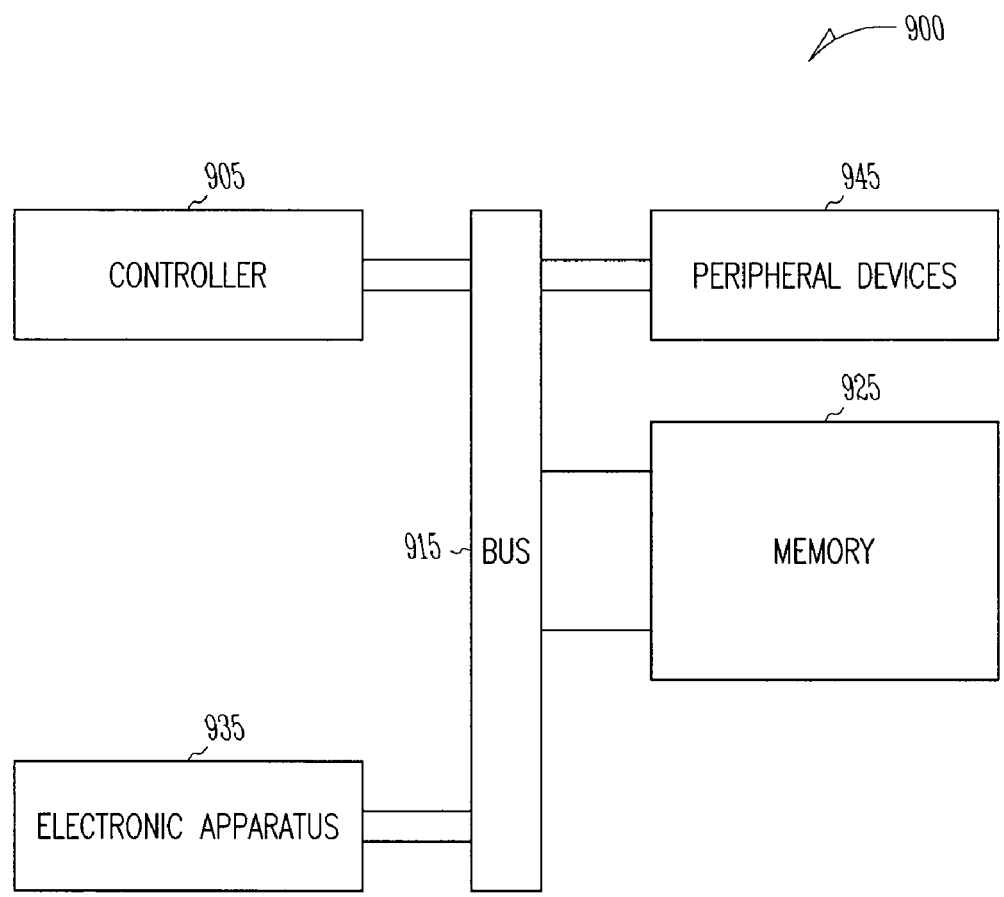
FIG. 9 illustrates a diagram for an embodiment of an electronic system having devices with a dielectric film containing an atomic layer deposited lanthanum aluminum oxide layer.

FIG. 9 depicts a diagram of an embodiment of a system 900 having a controller 905 and a memory 925. Controller 905 and/or memory 925 may include an embodiment of a dielectric layer having an atomic layer deposited lanthanum aluminum oxide layer. System 900 also includes an electronic apparatus 935, and a bus 915, where bus 915 provides electrical conductivity between controller 905 and electronic apparatus 935, and between controller 905 and memory 925. Bus 915 may include an address, a data bus, and a control bus, each independently configured. Alternately, bus 915 may use common conductive lines for providing address, data, and/or control, the use of which is regulated by controller 905. In an embodiment, electronic apparatus 935 may be additional memory configured similar as memory 925. An embodiment may include an additional peripheral device or devices 945 coupled to bus 915. In an embodiment, controller 905 is a processor. In an embodiment, controller 905 is a processor having a memory. Any of controller 905, memory 925, bus 915, electronic apparatus 935, and peripheral device devices 945 may include a dielectric layer having an atomic layer deposited lanthanum aluminum oxide layer. System 900 may include, but is not limited to, information handling devices, telecommunication systems, and computers.

Peripheral devices 945 may include displays, additional storage memory, or other control devices that may operate in conjunction with controller 905. Alternately, peripheral devices 945 may include displays, additional storage memory, or other control devices that may operate in conjunction with controller 905 and/or memory 925.

Memory 925 may be realized as a memory device containing an atomic layer deposited lanthanum aluminum oxide layer. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Formation of lanthanum aluminum oxide layers by an atomic layer deposition can be realized using a trisethylcyclopentadionatolanthanum precursor and/or a trisdipyvaloylmethanatolanthanum precursor to provide the lanthanum for the layer. Further, lanthanum aluminum oxide films formed by atomic layer deposition processed in relatively low temperatures can be amorphous and possess smooth surfaces. Such lanthanum aluminum oxide films can provide enhanced electrical properties due to their smoother surface resulting in reduced leakage current. Additionally, such dielectric layers provide a significantly thicker physical thickness than a silicon oxide layer having the same equivalent oxide thickness, where the increased thickness would also reduce leakage current. These properties of layers containing atomic layer deposited lanthanum aluminum oxide films allow for application as dielectric layers in numerous electronic devices and systems.

Capacitors, transistors, higher level ICs or devices including memory devices, and electronic systems are constructed utilizing the novel process for forming a dielectric film having an ultra thin equivalent oxide thickness, $t_{eq}$. Gate dielectric layers or films containing atomic layer deposited lanthanum aluminum oxide are formed having a dielectric constant (κ) substantially higher than that of silicon oxide, such that these dielectric films are capable of a $t_{eq}$ thinner than $SiO_2$ gate dielectrics of the same physical thickness. Alternately, the high dielectric constant relative to silicon dioxide allows the use of much larger physical thickness of these high-κ dielectric materials for the same $t_{eq}$ of $SiO_2$. Forming the relatively larger thickness aids in processing gate dielectrics and other dielectric layers in electronic devices and systems.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiment of the above structures and fabrication methods are used. The scope of the embodiments of the present invention should be determined with reference to the appended claims, along with the full scope of equivalents to which such claims are entitled.

What is claimed is:

1. An apparatus comprising:
   a substrate; and
   a dielectric material disposed above the substrate, the dielectric material containing a region of lanthanum-metal oxide, the lanthanum-metal oxide having an oxide composition without nitrogen, the metal of the lanthanum-metal oxide being a metal other than lanthanum, the lanthanum-metal oxide doped with a lanthanide other than lanthanum.

2. The apparatus of claim 1, wherein the lanthanum-metal oxide is structured as one or more monolayers.

3. The apparatus of claim 1, wherein the dielectric material consists essentially of the region.

4. The apparatus of claim 1, wherein the dielectric material includes a stack of insulating materials in addition to the region.

5. The apparatus of claim 1, wherein the dielectric material includes a dielectric metal oxide.

6. The apparatus of claim 5, wherein the dielectric metal oxide includes a metal different from the metal in the lanthanum-metal oxide.

7. The apparatus of claim 5, wherein the dielectric metal oxide includes a lanthanide oxide consisting essentially of the lanthanide of the lanthanide oxide and oxygen.

8. The apparatus of claim 1, wherein the dielectric material includes a dielectric nitride or a dielectric metal silicate.

9. The apparatus of claim 1, wherein the dielectric material includes an insulating non-lanthanide oxide.

10. The apparatus of claim 1, wherein the apparatus includes an interfacial region connecting the dielectric material to the substrate, the interfacial region including a lanthanum silicate, a metal silicate comprising the metal of the lanthanum-metal oxide, or a lanthanum metal silicate comprising the metal of the lanthanum-metal oxide.

11. The apparatus of claim 1, wherein the apparatus includes a metal electrode contacting the lanthanum-metal oxide, the metal electrode having a composition such that the metal electrode essentially does not undergo an interface reaction with the lanthanum-metal oxide.

12. The apparatus of claim 11, wherein the metal electrode contacting the lanthanum-metal oxide includes ruthenium.

13. The apparatus of claim 1, wherein the metal of the lanthanum-metal oxide is aluminum.

14. The apparatus of claim 1, wherein the dielectric material is disposed as a gate insulator in a silicon complementary metal-oxide semiconductor (CMOS) device.

15. The apparatus of claim 1, wherein the dielectric material is disposed as a capacitor in an integrated circuit, the integrated circuit configured as an analog integrated circuit, a radio frequency (RF) integrated circuit, or a mixed signal integrated circuit.

16. The apparatus of claim 1, wherein the dielectric material is disposed as a gate insulator or an inter-gate insulator in a transistor.

17. An apparatus comprising:
    a substrate; and
    a memory device disposed on the substrate, the memory device having a dielectric material disposed above the substrate, the dielectric material containing a region of lanthanum-metal oxide, the lanthanum-metal oxide having an oxide composition without nitrogen, the metal of the lanthanum-metal oxide being a metal other than lanthanum, the lanthanum-metal oxide doped with a lanthanide other than lanthanum.

18. The apparatus of claim 17, wherein the dielectric material is disposed as a gate insulator or an inter-gate insulator in a transistor of a flash memory device.

19. The apparatus of claim 17, wherein the dielectric material is disposed as a charge-storing nanolaminate dielectric in a flash memory device.

20. The apparatus of claim 17, wherein the dielectric material is disposed as a capacitor dielectric in a capacitor in a dynamic random access memory.

\* \* \* \* \*